US011181582B2

(12) United States Patent
Moura et al.

(10) Patent No.: US 11,181,582 B2
(45) Date of Patent: *Nov. 23, 2021

(54) METHOD AND APPARATUS FOR BRUSHLESS ELECTRICAL MACHINE CONTROL

(71) Applicant: Brooks Automation, Inc., Chelmsford, MA (US)

(72) Inventors: Jairo T. Moura, Marlboro, MA (US); Nathan Spiker, Boston, MA (US); Aaron Gawlik, Burlington, MA (US); Jayaraman Krishnasamy, Billerica, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/793,623

(22) Filed: Feb. 18, 2020

(65) Prior Publication Data
US 2020/0256919 A1    Aug. 13, 2020

Related U.S. Application Data

(63) Continuation of application No. 14/540,077, filed on Nov. 13, 2014, now Pat. No. 10,564,221.
(Continued)

(51) Int. Cl.
G01R 31/34 (2020.01)
G01L 3/22 (2006.01)
(Continued)

(52) U.S. Cl.
CPC ............ *G01R 31/34* (2013.01); *G01L 3/22* (2013.01); *H02P 6/10* (2013.01); *H02P 23/0031* (2013.01); *H02P 23/12* (2013.01); *H02P 25/098* (2016.02)

(58) Field of Classification Search
CPC ......... G01R 31/34; G01L 3/22; H02P 25/098; H02P 6/10; H02P 23/0031; H02P 23/12
(Continued)

(56) References Cited

U.S. PATENT DOCUMENTS 4,081,703 A    3/1978 Madsen et al.
4,197,488 A    4/1980 Kant
(Continued)

FOREIGN PATENT DOCUMENTS

CN    1502161    6/2004
CN    1574598    2/2005
(Continued)

OTHER PUBLICATIONS

International Search Report, International Application No. PCT/US2014/065422, dated Feb. 26, 2015.
(Continued)

*Primary Examiner* — Sheikh Maruf
(74) *Attorney, Agent, or Firm* — Perman & Green, LLP; Colin C. Durham

(57) ABSTRACT

A variable reluctance motor load mapping apparatus includes a frame, an interface disposed on the frame configured for mounting a variable reluctance motor, a static load cell mounted to the frame and coupled to the variable reluctance motor, and a controller communicably coupled to the static load cell and the variable reluctance motor, the controller being configured to select at least one motor phase of the variable reluctance motor, energize the at least one motor phase, and receive motor operational data from at least the static load cell for mapping and generating an array of motor operational data look up tables.

37 Claims, 24 Drawing Sheets

Related U.S. Application Data

(60) Provisional application No. 61/903,745, filed on Nov. 13, 2013.

(51) Int. Cl.
*H02P 23/12* (2006.01)
*H02P 23/00* (2016.01)
*H02P 6/10* (2006.01)
*H02P 25/098* (2016.01)

(58) Field of Classification Search
USPC .......................................................... 702/182
See application file for complete search history.

(56) References Cited

U.S. PATENT DOCUMENTS

| | | |
|---|---|---|
| 4,611,157 A | 9/1986 | Miller et al. |
| 4,626,719 A | 12/1986 | Foster |
| 4,661,756 A | 4/1987 | Murphy et al. |
| 4,670,696 A | 6/1987 | Byrne et al. |
| 4,748,362 A | 5/1988 | Hedlund |
| 4,868,477 A | 9/1989 | Anderson et al. |
| 4,917,925 A | 4/1990 | Loretti et al. |
| 4,922,197 A | 5/1990 | Juds et al. |
| 4,951,601 A | 8/1990 | Maydan et al. |
| 4,992,733 A | 2/1991 | Griebeler |
| 5,076,205 A | 12/1991 | Vowles et al. |
| 5,140,243 A | 8/1992 | Lyons et al. |
| 5,296,773 A | 3/1994 | El-Antably et al. |
| 5,376,862 A | 12/1994 | Stevens |
| 5,428,257 A | 6/1995 | Lurkens |
| 5,450,009 A | 9/1995 | Murakami |
| 5,475,304 A | 12/1995 | Prinz |
| 5,485,046 A | 1/1996 | Kaplan et al. |
| 5,522,653 A * | 6/1996 | Fulks ................. B60T 8/00 303/162 |
| 5,539,266 A | 7/1996 | Stevens |
| 5,545,964 A | 8/1996 | Stephenson et al. |
| 5,584,647 A | 12/1996 | Uehara et al. |
| 5,621,294 A | 4/1997 | Bessette et al. |
| 5,623,177 A | 4/1997 | Dimatteo et al. |
| 5,652,493 A | 7/1997 | Hendershot, Jr. |
| 5,720,590 A | 2/1998 | Hofmeister |
| 5,739,663 A | 4/1998 | Brown |
| 5,813,823 A | 9/1998 | Hofmeister |
| 5,828,153 A | 10/1998 | McClelland |
| 5,852,355 A | 12/1998 | Turner |
| 5,855,681 A | 1/1999 | Maydan et al. |
| 5,864,477 A | 1/1999 | Webster |
| 5,871,588 A | 2/1999 | Moslehi et al. |
| 5,894,760 A | 4/1999 | Caveney |
| 5,899,658 A | 5/1999 | Hofmeister |
| 5,914,548 A | 6/1999 | Watanabe et al. |
| 5,923,141 A | 7/1999 | McHugh |
| 6,091,170 A | 7/2000 | Mayes et al. |
| 6,114,789 A | 9/2000 | Pengov et al. |
| 6,150,791 A | 11/2000 | Fulton |
| 6,181,036 B1 | 1/2001 | Kazama et al. |
| 6,201,368 B1 | 3/2001 | Webster |
| 6,203,294 B1 | 3/2001 | Turley et al. |
| 6,225,767 B1 | 5/2001 | Lovett et al. |
| 6,242,874 B1 | 6/2001 | Kalpathi et al. |
| 6,252,325 B1 | 6/2001 | Nashiki |
| 6,285,101 B1 | 9/2001 | Kazama et al. |
| 6,297,613 B1 | 10/2001 | Elliott et al. |
| 6,305,694 B1 | 10/2001 | Yamazumi et al. |
| 6,313,597 B1 | 11/2001 | Elliott et al. |
| 6,335,578 B1 | 1/2002 | Katsumi et al. |
| 6,372,293 B1 | 4/2002 | Mathus et al. |
| 6,460,567 B1 | 10/2002 | Hansen, III et al. |
| 6,468,353 B1 | 10/2002 | Perlov et al. |
| 6,492,756 B1 | 12/2002 | Maslov et al. |
| 6,498,447 B2 | 12/2002 | Mann et al. |
| 6,525,504 B1 | 2/2003 | Nygren et al. |
| 6,548,932 B1 | 4/2003 | Weiglhofer et al. |
| 6,617,712 B1 | 9/2003 | Dondi |
| 6,639,378 B2 | 10/2003 | Turner et al. |
| 6,700,272 B1 | 3/2004 | Lindner |
| 6,758,876 B2 | 7/2004 | Suzuki et al. |
| 6,759,826 B2 | 7/2004 | Tankard |
| 6,794,791 B2 | 9/2004 | Ben Ahmed et al. |
| 6,823,725 B2 | 11/2004 | Lohberg |
| 6,828,710 B1 | 12/2004 | Gabrys |
| 6,857,635 B1 | 2/2005 | Li et al. |
| 6,900,573 B2 | 5/2005 | Edwards et al. |
| 6,936,992 B2 | 8/2005 | Elliott et al. |
| 7,057,362 B2 | 6/2006 | Norman |
| 7,071,659 B1 | 7/2006 | Torrey et al. |
| 7,090,222 B2 | 8/2006 | Watanabe et al. |
| 7,141,965 B2 | 11/2006 | Breuer et al. |
| 7,208,906 B2 | 4/2007 | Turner et al. |
| 7,230,360 B2 | 6/2007 | Desai et al. |
| RE39,748 E | 7/2007 | Watanabe et al. |
| 7,268,516 B2 | 9/2007 | Tankard |
| 7,321,113 B2 | 1/2008 | Hare et al. |
| 7,368,705 B2 | 5/2008 | Hare et al. |
| 7,392,565 B2 | 7/2008 | Holbrook et al. |
| 7,405,556 B2 | 7/2008 | Breuer et al. |
| 7,427,845 B2 | 9/2008 | Burse |
| 7,592,712 B2 | 9/2009 | Perlo et al. |
| 7,608,813 B1 | 10/2009 | Milvich et al. |
| 7,639,005 B2 | 12/2009 | Qian et al. |
| 7,719,159 B2 | 5/2010 | Petro et al. |
| 7,804,269 B2 | 9/2010 | Randall |
| 7,834,618 B2 | 11/2010 | Moura et al. |
| 7,852,070 B2 | 12/2010 | Yamada et al. |
| 7,901,539 B2 | 3/2011 | Bluck et al. |
| 7,904,182 B2 | 3/2011 | Hosek et al. |
| 7,906,931 B2 | 3/2011 | Randall |
| 7,950,890 B2 | 5/2011 | Nakamura et al. |
| 7,988,398 B2 | 8/2011 | Hofmeister et al. |
| 7,994,676 B2 * | 8/2011 | Imazu .................... H02K 1/243 310/166 |
| 8,008,884 B2 | 8/2011 | Krupyshev et al. |
| 8,094,323 B2 | 1/2012 | Kapner |
| 8,129,984 B2 | 3/2012 | Hosek et al. |
| 8,222,892 B2 | 7/2012 | Hosek et al. |
| 8,293,066 B2 | 10/2012 | Bluck et al. |
| 8,303,764 B2 | 11/2012 | Bluck et al. |
| 8,309,906 B2 | 11/2012 | Kapner et al. |
| 8,419,341 B2 | 4/2013 | Hoey et al. |
| 8,450,999 B2 | 5/2013 | Wolschlager et al. |
| 8,749,105 B2 | 6/2014 | Arita et al. |
| 9,541,611 B2 | 1/2017 | Wang et al. |
| 2001/0010453 A1 | 8/2001 | Marcinkiewicz |
| 2001/0024611 A1 | 9/2001 | Woodruff et al. |
| 2001/0036398 A1 | 11/2001 | Hofmeister |
| 2002/0125782 A1 | 9/2002 | Peachee et al. |
| 2002/0135358 A1 | 9/2002 | Sager et al. |
| 2002/0175653 A1 | 11/2002 | Elliot et al. |
| 2002/0185990 A1 | 12/2002 | Elliott et al. |
| 2003/0016686 A1 | 1/2003 | Wynne et al. |
| 2003/0019686 A1 | 1/2003 | Fukuda et al. |
| 2003/0042864 A1 | 3/2003 | Lequesne et al. |
| 2004/0052125 A1 | 3/2004 | Tankard |
| 2004/0066165 A1 * | 4/2004 | Kamio ................ H02P 8/42 318/701 |
| 2004/0151562 A1 | 8/2004 | Hofmeister et al. |
| 2004/0189240 A1 | 9/2004 | Islam et al. |
| 2005/0011288 A1 | 1/2005 | Flammer et al. |
| 2005/0105991 A1 | 5/2005 | Hofmeister et al. |
| 2005/0120578 A1 | 6/2005 | Vandermeulen |
| 2005/0212371 A1 | 9/2005 | McClelland |
| 2006/0017340 A1 | 1/2006 | Kozaki et al. |
| 2006/0021176 A1 | 2/2006 | Moein et al. |
| 2006/0036384 A1 | 2/2006 | Moriarty et al. |
| 2006/0036385 A1 | 2/2006 | Tankard |
| 2006/0045664 A1 | 3/2006 | Niewmierzycki et al. |
| 2006/0053577 A1 | 3/2006 | Moein et al. |
| 2006/0073276 A1 | 4/2006 | Antonissen |
| 2006/0102078 A1 | 5/2006 | Fairbairn et al. |
| 2006/0175913 A1 | 8/2006 | Hempe et al. |
| 2006/0182529 A1 | 8/2006 | Hiroki |
| 2007/0020081 A1 | 1/2007 | Gilchrist et al. |

(56) References Cited

U.S. PATENT DOCUMENTS

| | | |
|---|---|---|
| 2007/0022304 A1 | 1/2007 | Yanagawa |
| 2007/0029890 A1 | 2/2007 | Deodhar et al. |
| 2007/0183871 A1 | 8/2007 | Hofmeister et al. |
| 2007/0280813 A1 | 12/2007 | Nakamura et al. |
| 2008/0011334 A1 | 1/2008 | Rye et al. |
| 2008/0019816 A1 | 1/2008 | Sato |
| 2008/0116886 A1 | 5/2008 | Yamada et al. |
| 2008/0121064 A1 | 5/2008 | Todorov |
| 2008/0131228 A1 | 6/2008 | Sheets |
| 2008/0290762 A1 | 11/2008 | Lott et al. |
| 2009/0001917 A1 | 1/2009 | Hosek et al. |
| 2009/0003976 A1 | 1/2009 | Hofmeister et al. |
| 2009/0015248 A1* | 1/2009 | Moura .................. G01D 5/147 324/207.26 |
| 2009/0033173 A1 | 2/2009 | Moura et al. |
| 2009/0078134 A1 | 3/2009 | Rothlein et al. |
| 2009/0102460 A1 | 4/2009 | Schott et al. |
| 2009/0140748 A1 | 6/2009 | Lindsey et al. |
| 2009/0162179 A1 | 6/2009 | Hosek et al. |
| 2009/0167119 A1 | 7/2009 | Nakayama et al. |
| 2009/0191030 A1 | 7/2009 | Bluck et al. |
| 2009/0243413 A1* | 10/2009 | Gilchrist .................. H02K 7/09 310/90.5 |
| 2010/0063775 A1* | 3/2010 | Colling .................. G01M 15/00 702/182 |
| 2010/0123426 A1* | 5/2010 | Nashiki .................. H02K 1/12 318/701 |
| 2010/0295389 A1* | 11/2010 | Tessier .................. H02K 29/08 310/46 |
| 2011/0058967 A1 | 3/2011 | Arita et al. |
| 2011/0077892 A1 | 3/2011 | Emami et al. |
| 2011/0133582 A1* | 6/2011 | Bingler .................. F04D 13/08 310/71 |
| 2011/0171887 A1 | 7/2011 | Tanimoto et al. |
| 2011/0173496 A1 | 7/2011 | Hosek et al. |
| 2011/0181221 A1 | 7/2011 | Asahi et al. |
| 2011/0234130 A1 | 9/2011 | Okumura |
| 2011/0308335 A1 | 12/2011 | Pink et al. |
| 2012/0038348 A1 | 2/2012 | Aimuta et al. |
| 2012/0056575 A1 | 3/2012 | Dial |
| 2012/0076626 A1 | 3/2012 | Hoey et al. |
| 2012/0098381 A1 | 4/2012 | Seki et al. |
| 2012/0223597 A1 | 9/2012 | Hosek et al. |
| 2013/0009579 A1 | 1/2013 | Henderson et al. |
| 2013/0014605 A1* | 1/2013 | Caveney .................. B25J 18/04 74/490.03 |
| 2013/0026764 A1 | 1/2013 | Hayashi et al. |
| 2013/0026864 A1 | 1/2013 | Bae et al. |
| 2013/0028700 A1 | 1/2013 | Gilchrist et al. |
| 2013/0033219 A1* | 2/2013 | Kakimoto .................. H02P 23/22 318/569 |
| 2013/0057263 A1* | 3/2013 | Hosek .................. G01D 5/2266 324/207.18 |
| 2013/0069450 A1 | 3/2013 | Hosek et al. |
| 2013/0076177 A1 | 3/2013 | Seok |
| 2013/0085002 A1 | 4/2013 | Hosek |
| 2013/0088111 A1* | 4/2013 | Park .................. H02K 1/2773 310/156.12 |
| 2013/0099707 A1 | 4/2013 | Okubo |
| 2013/0134912 A1 | 5/2013 | Khalil et al. |
| 2013/0175904 A1 | 7/2013 | Jang et al. |
| 2013/0193812 A1 | 8/2013 | Oishi |
| 2013/0249543 A1 | 9/2013 | Lee |
| 2014/0002001 A1* | 1/2014 | Kinashi .................. H02K 11/225 318/724 |
| 2014/0150592 A1 | 6/2014 | Kremerman |
| 2014/0167662 A1* | 6/2014 | Ajima .................. H02P 21/18 318/400.04 |
| 2014/0246893 A1 | 9/2014 | Tesar |
| 2015/0171709 A1 | 6/2015 | Ito et al. |
| 2015/0331052 A1 | 11/2015 | Seeley et al. |
| 2015/0346717 A1 | 12/2015 | Hosek et al. |
| 2016/0161561 A1 | 6/2016 | Chen et al. |

FOREIGN PATENT DOCUMENTS

| | | |
|---|---|---|
| CN | 101662257 | 3/2010 |
| CN | 102027658 | 4/2011 |
| CN | 102457149 | 5/2012 |
| CN | 103036332 | 4/2013 |
| CN | 103219856 | 7/2013 |
| DE | 102007034636 | 11/2007 |
| EP | 0756373 | 1/1997 |
| JP | 4725101 | 11/1972 |
| JP | 5152808 | 4/1976 |
| JP | 58154612 | 9/1983 |
| JP | 02206389 | 8/1990 |
| JP | 02206391 | 8/1990 |
| JP | 03145958 | 6/1991 |
| JP | 03277148 | 12/1991 |
| JP | 04046781 | 2/1992 |
| JP | 5316706 | 11/1993 |
| JP | 089676 | 1/1996 |
| JP | 08119409 | 5/1996 |
| JP | 09238438 | 9/1997 |
| JP | 10170212 | 6/1998 |
| JP | 2001112223 | 4/2001 |
| JP | 2001221359 | 8/2001 |
| JP | 2001255220 | 9/2001 |
| JP | 2002059386 | 2/2002 |
| JP | 2002066976 | 3/2002 |
| JP | 2003039376 | 2/2003 |
| JP | 2003339128 | 11/2003 |
| JP | 2004023890 | 1/2004 |
| JP | 2004242444 | 8/2004 |
| JP | 2005124309 | 5/2005 |
| JP | 2005199746 | 7/2005 |
| JP | 2006094577 | 4/2006 |
| JP | 2006162557 | 6/2006 |
| JP | 2006284299 | 10/2006 |
| JP | 2006529081 | 12/2006 |
| JP | 2007097257 | 4/2007 |
| JP | 2007151269 | 6/2007 |
| JP | 2008537472 | 9/2008 |
| JP | 2009142101 | 6/2009 |
| JP | 10052002 | 3/2010 |
| JP | 2010052002 | 3/2010 |
| JP | 2010183806 | 8/2010 |
| JP | 2010532154 | 9/2010 |
| JP | 2011514652 | 5/2011 |
| JP | 4725101 | 7/2011 |
| JP | 2011153864 | 8/2011 |
| JP | 2012100502 | 5/2012 |
| JP | 2012518172 | 8/2012 |
| JP | 2013021913 | 1/2013 |
| JP | 2013027261 | 2/2013 |
| JP | 2013101030 | 5/2013 |
| JP | 5274702 | 8/2013 |
| JP | 2013195429 | 9/2013 |
| JP | 2013198307 | 9/2013 |
| KR | 1020050002151 | 7/2005 |
| KR | 20130013962 | 2/2013 |
| KR | 20130109766 | 10/2013 |
| TW | 201106577 | 2/2011 |
| TW | 201238232 | 9/2012 |
| WO | 2003021761 | 3/2003 |
| WO | 2008081684 | 7/2008 |
| WO | 2009003193 | 12/2008 |
| WO | 2009003196 | 12/2008 |
| WO | 2009012396 | 1/2009 |
| WO | 2011139682 | 11/2011 |
| WO | 2012167316 | 12/2012 |
| WO | 2013010053 | 1/2013 |
| WO | 2013032525 | 3/2013 |

OTHER PUBLICATIONS

International Search Report, International Application No. PCT/US2014065432, dated Feb. 24, 2015.

International Search Report, International Application No. PCT/US2014/065392, dated Mar. 13, 2015.

(56) References Cited

OTHER PUBLICATIONS

International Search Report, International Application No. PCTUS2014/065414, dated Feb. 26, 2015.
Supplementary Partial European Search Report, International Application No. EP 14862821 dated Nov. 23, 2017.
TW_IPO_Search_Report Aplication No. 10313929 dated Sep. 12, 2018.

* cited by examiner

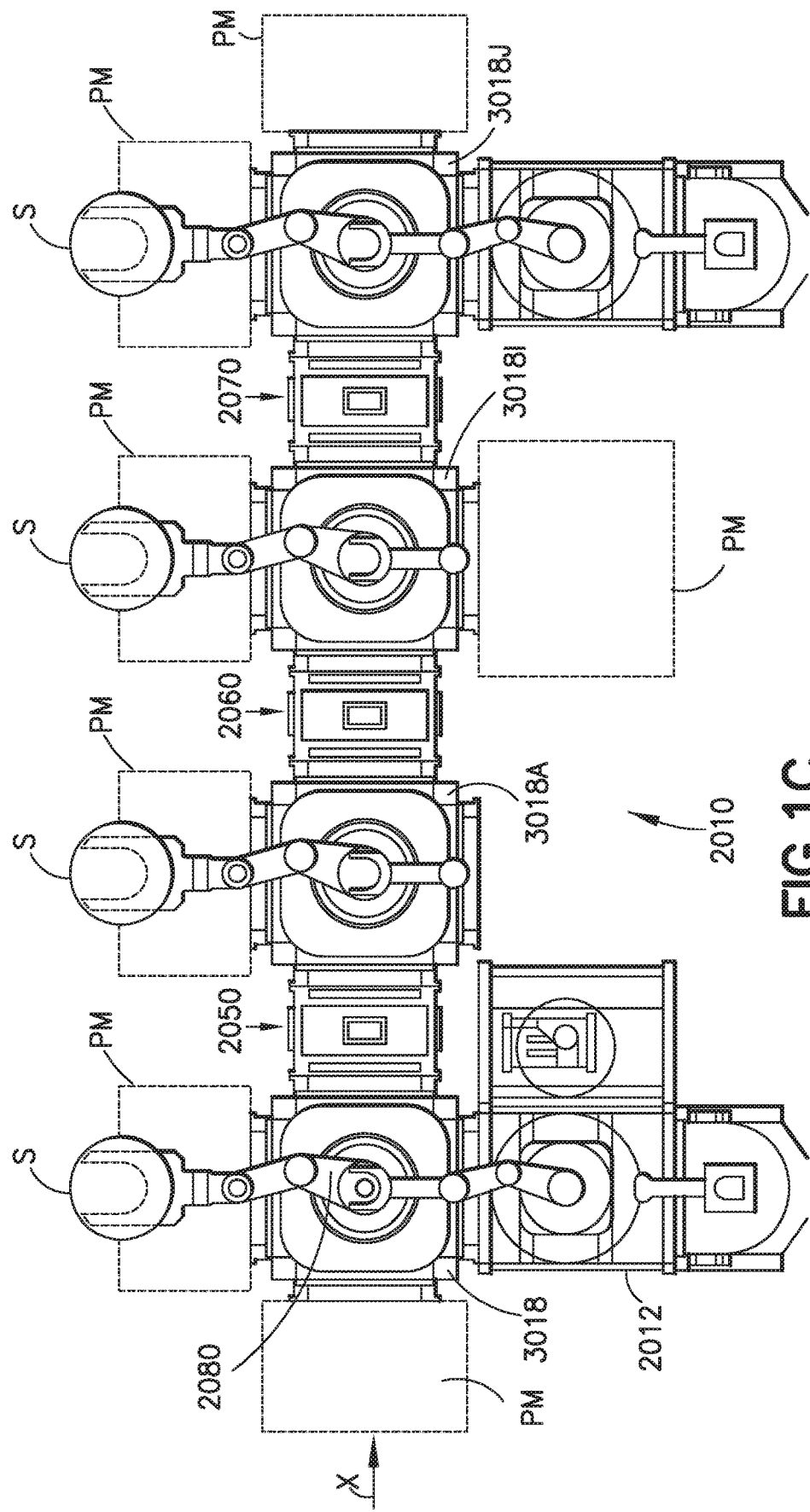

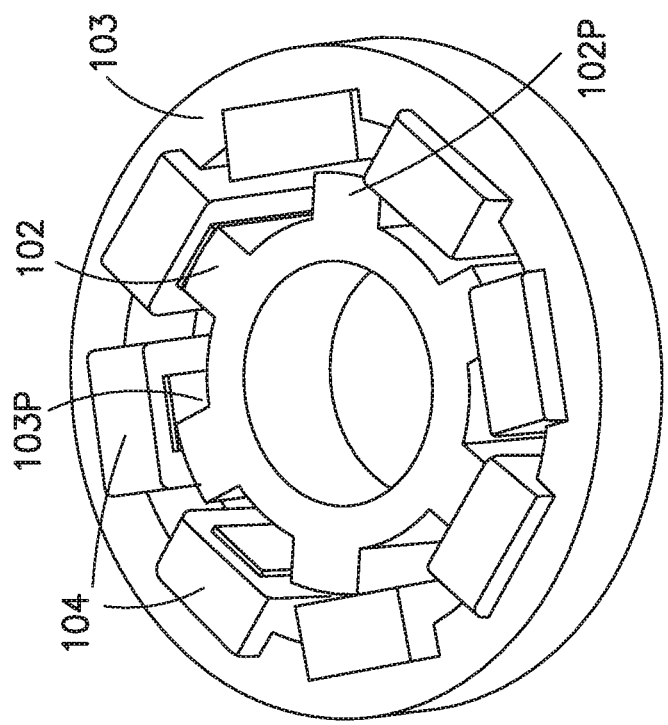
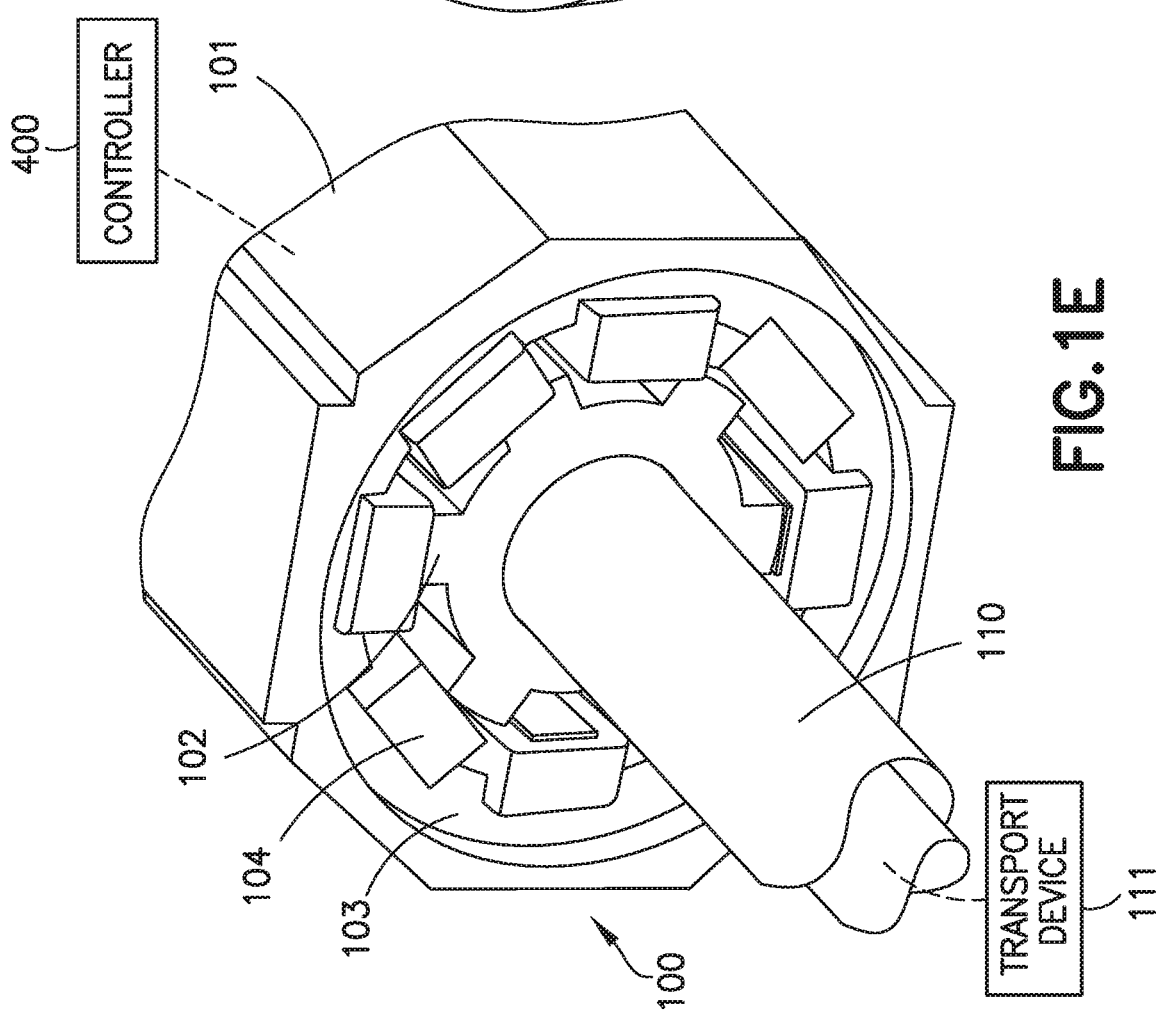

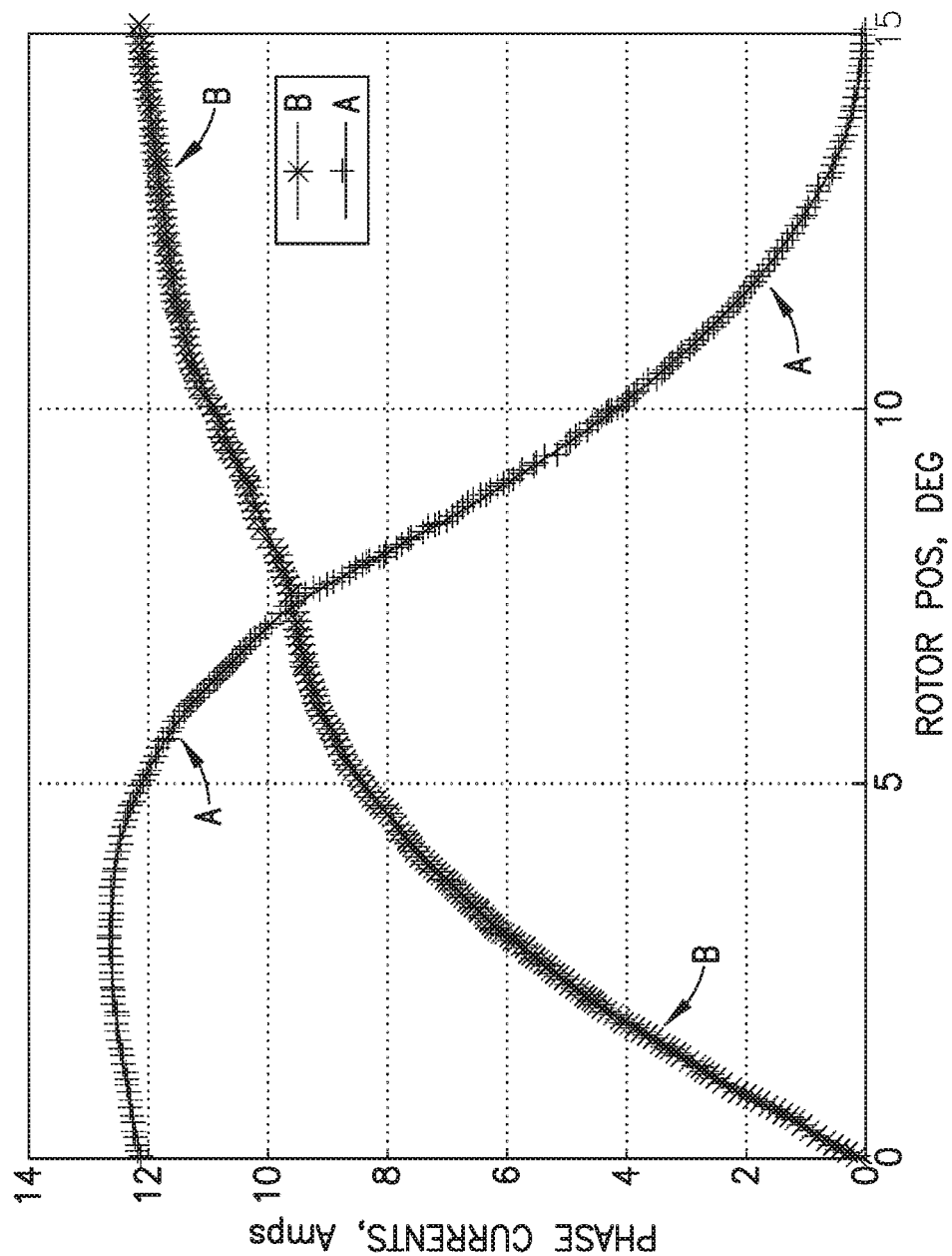

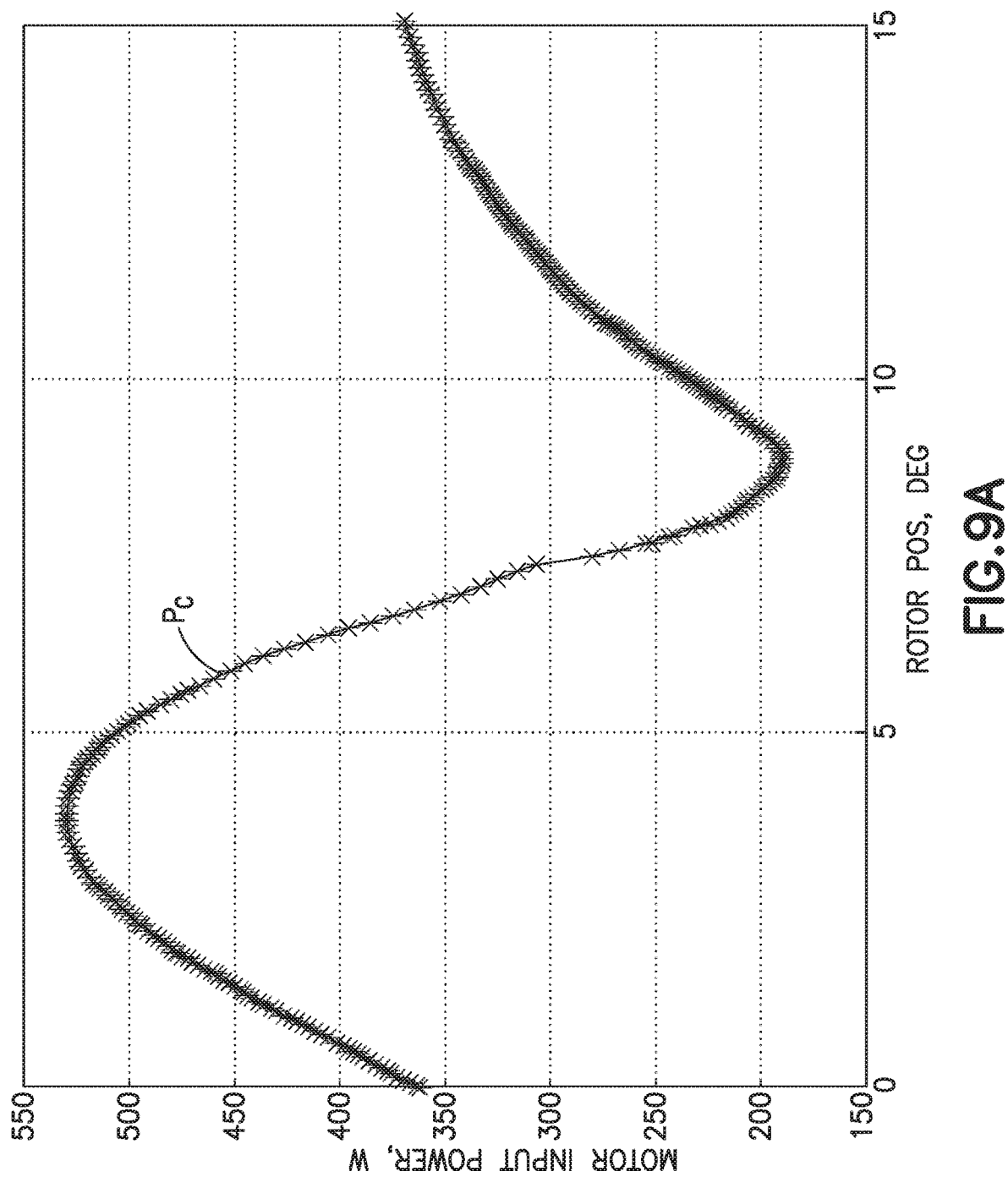

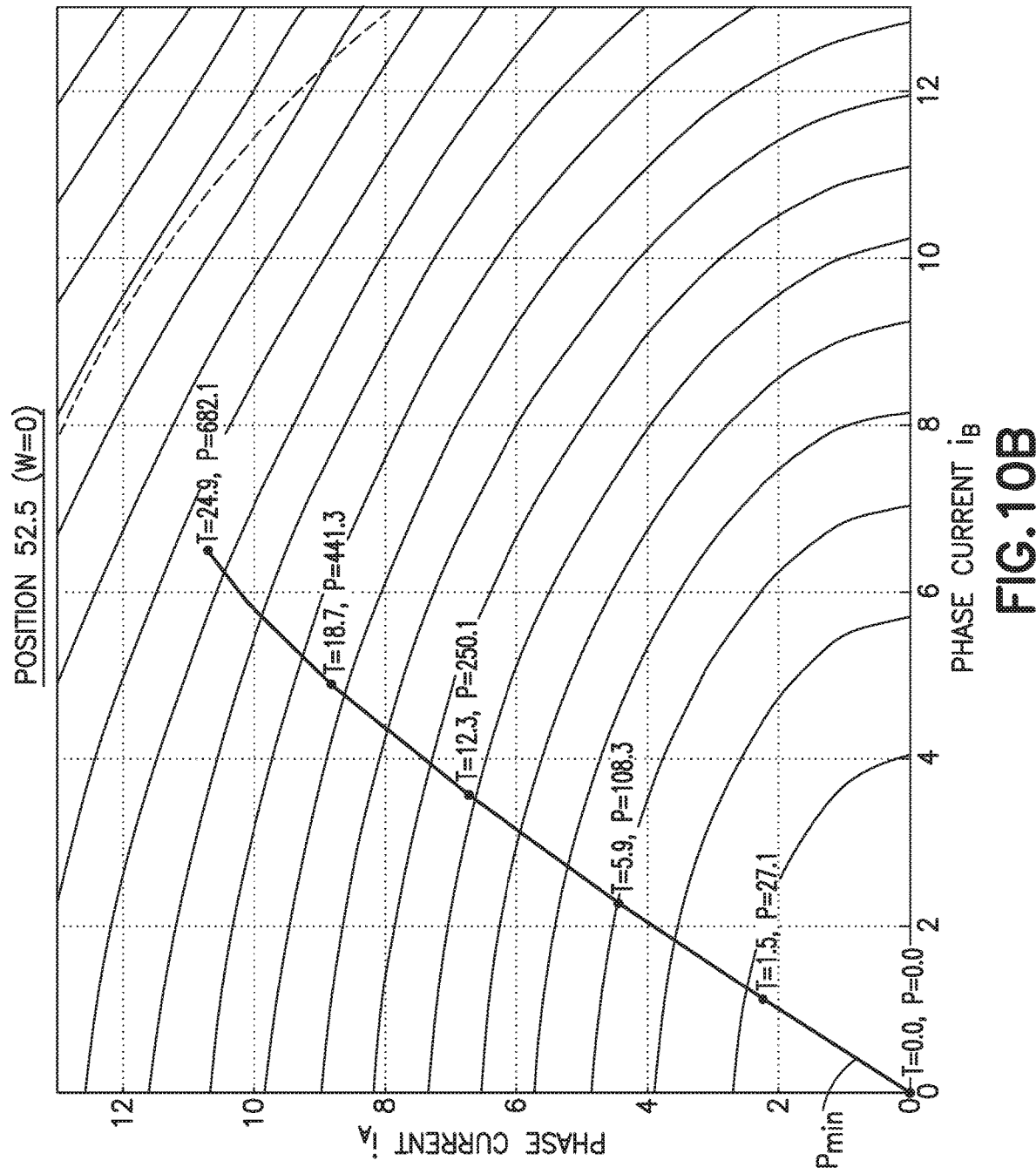

METHOD AND APPARATUS FOR BRUSHLESS ELECTRICAL MACHINE CONTROL

CROSS-REFERENCE TO RELATED APPLICATIONS

This application is a continuation of U.S. application Ser. No. 14/540,077, filed Nov. 13, 2014, now U.S. Pat. No. 10,564,221, which claims priority from and benefit of U.S. provisional application number 61/903,745 filed on Nov. 13, 2013, the disclosures of which are incorporated herein by reference in their entirety.

BACKGROUND

1. Field

The exemplary embodiments generally relate to electrical machines and, more particularly, to control of the electrical machines.

2. Brief Description of Related Developments

Generally variable (or switched) reluctance motors (VRM) are being sought as a cost effective alternative to brushless direct current motors. Variable reluctance motors do not require magnets and their mechanical construction is simple however, the usage of variable reluctance motors for precision control remains challenging due to, for example, high non-linear relationships between the phase current, rotor electrical position, torque and geometry. One of the main challenges in precision control of variable reluctance motors is providing a smooth and ripple free pre-specified torque at any given position of the rotor. The torque ripple inherent with variable reluctance motors may be due to modeling uncertainties. As a result, the performance of variable reluctance motors may be dependent on the existence of an accurate commutation model that relates desired torque with phase currents and position. In addition, typical feedback loops, as in conventional off the shelf amplifiers, are generally designed and optimally tuned for a fixed inductance, which variable reluctance motors generally do not have. In variable reluctance motors changes in the motor coil or winding inductances are expected because this is the primary mechanism of mechanical torque generation for variable reluctance motors.

In, for example, robot servo applications, the servo performance may be influenced by the dynamic response of the actuator or motor. A slow motor response may limit the speed of response of the servo system. In robot servo applications using motors as actuators, it is typically assumed that the motor response is at least an order of magnitude faster than that of the servo loop and is often ignored in the system model, which is particularly the case with brushless direct current motors. Variable reluctance motors however, have a relatively slower response that may warrant certain adjustments to the commutation strategy to compensate for the slow response. As such, substantially instantaneous torque control may be required for variable reluctance motor drive use in position servo applications. Instantaneous torque control may be provided through, for example, digital electronic controllers that may control the current through each motor phase as a function of motor position and required instantaneous torque. The determination of current required in each motor phase as a function of motor position and torque may be referred to as current commutation. In three phase permanent magnet brushless motors (where the three phase currents are 120 degrees apart) the current through each motor winding is sinusoidal and is a uniquely defined function of rotor position and torque. On the other hand, the phase currents in a variable reluctance motor are not sinusoidal, but rather have a shape that is derived from motor torque curves. The motor torque curves for a motor are either measured or determined from a finite element analysis of a motor model. In general, for a switched reluctance motor the torque may be a function of motor position as well as each of the phase currents. The purpose of current commutation is to determine a required current in each motor phase as a function of motor position and motor torque.

It would be advantageous to minimize the effects of torque ripple on the control of variable reluctance motors. It would also be advantageous to provide an optimal commutation scheme that provides an approach to computing currents in each motor phase so that one or more optimization criteria are accomplished. It would be further advantageous to provide a control system that alleviates the dependency of an accurate commutation model for variable reluctance motors.

BRIEF DESCRIPTION OF THE DRAWINGS

The foregoing aspects and other features of the disclosed embodiment are explained in the following description, taken in connection with the accompanying drawings, wherein:

FIGS. 1A-1D are schematic illustrations of substrate processing tools in accordance with aspects of the disclosed embodiment;

FIGS. 1E and 1F are schematic illustrations of portions of a variable reluctance motor in accordance with aspects of the disclosed embodiment;

FIGS. 8A and 1B illustrate exemplary phase current tables with respect to rotor position in accordance with aspects of the disclosed embodiment;

FIGS. 9A and 9B illustrate exemplary motor input power tables with respect to rotor position in accordance with aspects of the disclosed embodiment;

FIGS. 10A and 10B illustrate portions of iso-torque curve tables in accordance with aspects of the disclosed embodiment;

DETAILED DESCRIPTION

In accordance with aspects of the disclosed embodiment, a switched reluctance brushless electrical machine or motor and optimal commutation schemes or strategies therefore are provided. Commutation schemes or strategies refer to the determination of current in each motor phase as a function of motor position and desired torque. Although the aspects of the disclosed embodiment will be described with reference to the drawings, it should be understood that the aspects of the disclosed embodiment can be embodied in many forms. In addition, any suitable size, shape or type of elements or materials could be used.

Referring to FIGS. 1A-1D, there are shown schematic views of substrate processing apparatus or tools incorporating the aspects of the disclosed embodiment as disclosed further herein.

Figure 1A:
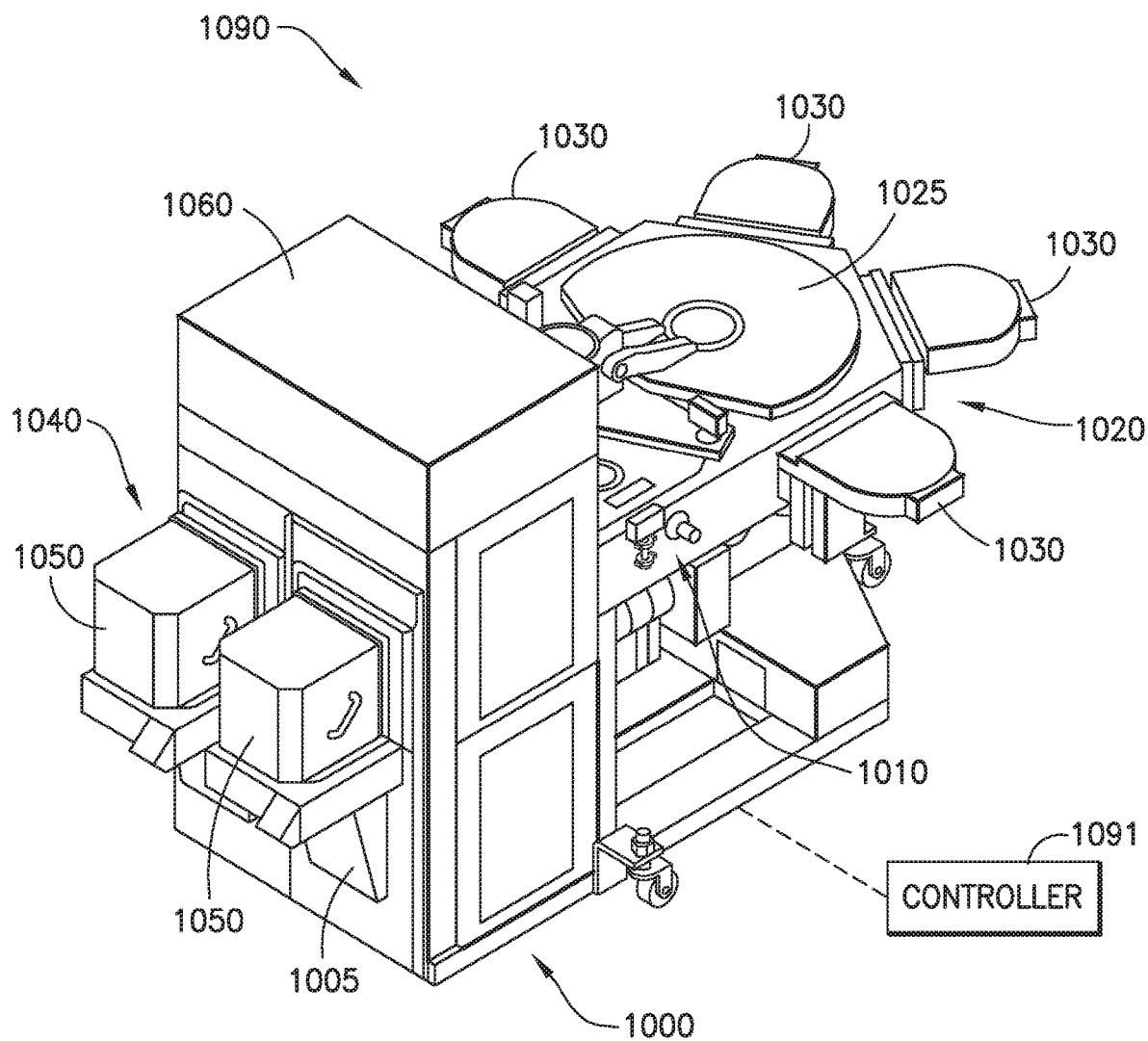
Figure 1B:
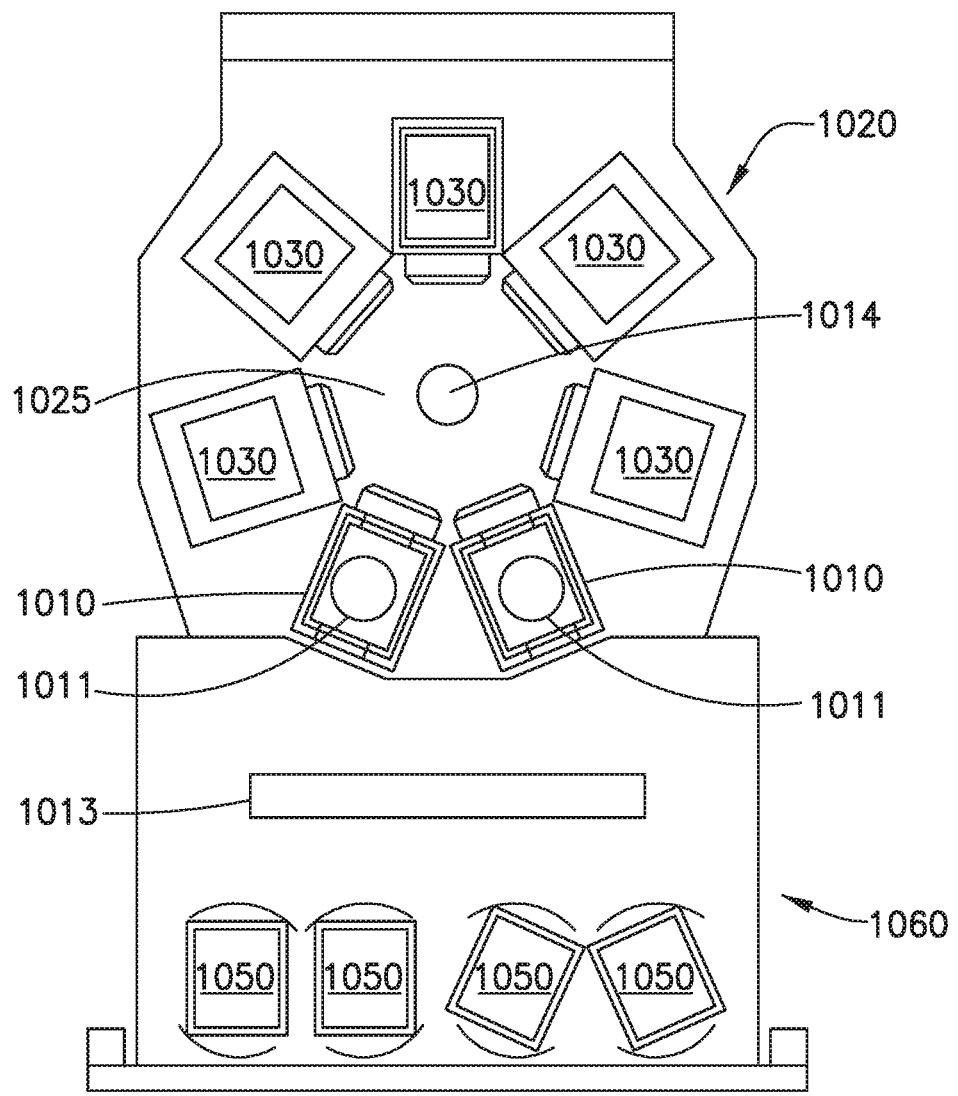

Referring to FIGS. 1A and 1B, a processing apparatus, such as for example a semiconductor tool station 1090 is shown in accordance with an aspect of the disclosed embodiment. Although a semiconductor tool is shown in the drawings, the aspects of the disclosed embodiment described herein can be applied to any tool station or application employing robotic manipulators. In this example the tool 1090 is shown as a cluster tool, however the aspects of the disclosed embodiment may be applied to any suitable tool station such as, for example, a linear tool station such as that shown in FIGS. 1C and 1D and described in U.S. patent application Ser. No. 11/442,511, entitled "Linearly Distributed Semiconductor Workpiece Processing Tool," filed May 26, 2006, the disclosure of which is incorporated by reference herein in its entirety. The tool station 1090 generally includes an atmospheric front end 1000, a vacuum load lock 1010 and a vacuum back end 1020. In other aspects, the tool station may have any suitable configuration. The components of each of the front end 1000, load lock 1010 and back end 1020 may be connected to a controller 1091 which may be part of any suitable control architecture such as, for example, a clustered architecture control. The control system may be a closed loop controller having a master controller, cluster controllers and autonomous remote controllers such as those disclosed in U.S. patent application Ser. No. 11/178,615, entitled "Scalable Motion Control System," filed Jul. 11, 2005, the disclosure of which is incorporated by reference herein in its entirety. In other aspects, any suitable controller and/or control system may be utilized.

In one aspect, the front end 1000 generally includes load port modules 1005 and a mini-environment 1060 such as for example an equipment front end module (EFEM). The load port modules 1005 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer interfaces or any other suitable substrate interfaces such as for example larger or smaller wafers or flat panels for flat panel displays. Although two load port modules are shown in FIG. 1A, in other aspects any suitable number of load port modules may be incorporated into the front end 1000. The load port modules 1005 may be configured to receive substrate carriers or cassettes 1050 from an overhead transport system, automatic guided vehicles, person guided vehicles, rail guided vehicles or from any other suitable transport method. The load port modules 1005 may interface with the mini-environment 1060 through load ports 1040. The load ports 1040 may allow the passage of substrates between the substrate cassettes 1050 and the mini-environment 1060. The mini-environment 1060 generally includes any suitable transfer robot 1013 which may incorporate one or more aspects of the disclosed embodiment described herein. In one aspect the robot 1013 may be a track mounted robot such as that described in, for example, U.S. Pat. No. 6,002,840, the disclosure of which is incorporated by reference herein in its entirety. The mini-environment 1060 may provide a controlled, clean zone for substrate transfer between multiple load port modules.

The vacuum load lock 1010 may be located between and connected to the mini-environment 1060 and the back end 1020. It is noted that the term vacuum as used herein may denote a high vacuum such as 10-5 Torr or below in which the substrate are processed. The load lock 1010 generally includes atmospheric and vacuum slot valves. The slot valves may provide the environmental isolation employed to evacuate the load lock after loading a substrate from the atmospheric front end and to maintain the vacuum in the transport chamber when venting the lock with an inert gas such as nitrogen. The load lock 1010 may also include an aligner 1011 for aligning a fiducial of the substrate to a desired position for processing. In other aspects, the vacuum load lock may be located in any suitable location of the processing apparatus and have any suitable configuration.

The vacuum back end 1020 generally includes a transport chamber 1025, one or more processing station(s) 1030 and any suitable transfer robot 1014 which may include one or more aspects of the disclosed embodiments described herein. The transfer robot 1014 will be described below and may be located within the transport chamber 1025 to transport substrates between the load lock 1010 and the various processing stations 1030. The processing stations 1030 may operate on the substrates through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The processing stations 1030 are connected to the transport chamber 1025 to allow substrates to be passed from the transport chamber 1025 to the processing stations 1030 and vice versa.

Referring now to FIG. 1C, a schematic plan view of a linear substrate processing system 2010 is shown where the tool interface section 2012 is mounted to a transport chamber module 3018 so that the interface section 2012 is facing generally towards (e.g. inwards) but is offset from the longitudinal axis X of the transport chamber 3018. The transport chamber module 3018 may be extended in any suitable direction by attaching other transport chamber modules 3018A, 3018I, 3018J to interfaces 2050, 2060, 2070 as described in U.S. patent application Ser. No. 11/442,511, previously incorporated herein by reference. Each transport chamber module 3018, 3019A, 3018I, 3018J includes any suitable substrate transport 2080, which may include one or more aspects of the disclosed embodiment described herein, for transporting substrates throughout the processing system 2010 and into and out of, for example, processing modules PM. As may be realized, each chamber module may be capable of holding an isolated or controlled atmosphere (e.g. N2, clean air, vacuum).

Figure 1D:
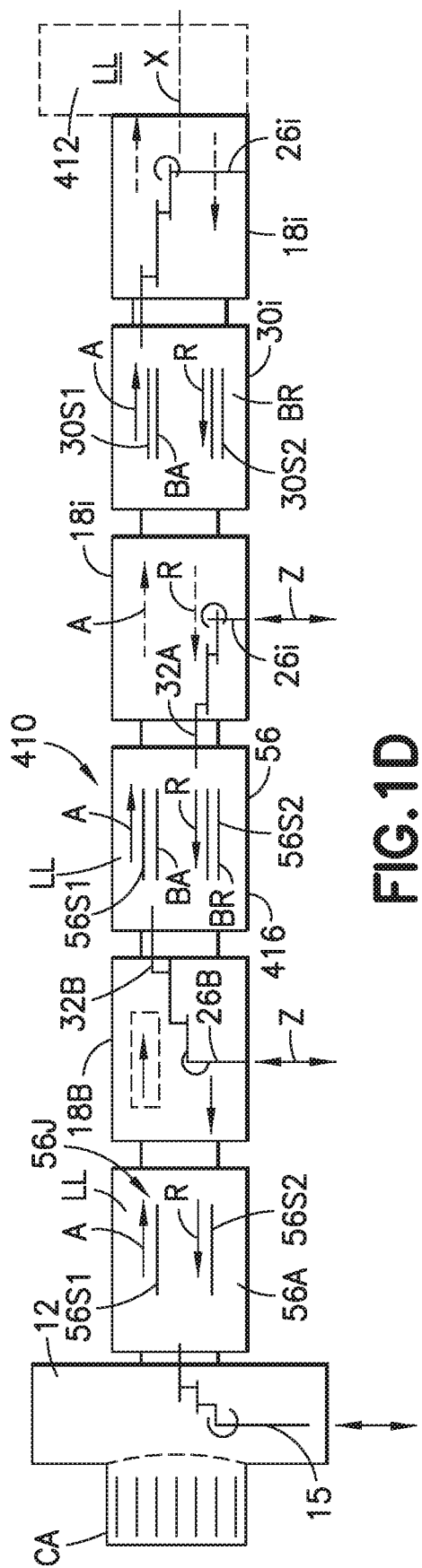

Referring to FIG. 1D, there is shown a schematic elevation view of an exemplary processing tool 410 such as may be taken along longitudinal axis X of the linear transport chamber 416. In the aspect of the disclosed embodiment shown in FIG. 1D, tool interface section 12 may be representatively connected to the transport chamber 416. In this aspect, interface section 12 may define one end of the tool transport chamber 416. As seen in FIG. 1D, the transport chamber 416 may have another workpiece entry/exit station 412 for example at an opposite end from interface station 12. In other aspects, other entry/exit stations for inserting/removing workpieces from the transport chamber may be provided. In one aspect, interface section 12 and entry/exit station 412 may allow loading and unloading of workpieces from the tool. In other aspects, workpieces may be loaded into the tool from one end and removed from the other end. In one aspect, the transport chamber 416 may have one or more transfer chamber module(s) 18B, 18i. Each chamber module may be capable of holding an isolated or controlled atmosphere (e.g. N2, clean air, vacuum). As noted before, the configuration/arrangement of the transport chamber modules 18B, 18i, load lock modules 56A, 56B and workpiece stations forming the transport chamber 416 shown in FIG. 1D is merely exemplary, and in other aspects the transport chamber may have more or fewer modules disposed in any desired modular arrangement. In the aspect shown, station 412 may be a load lock. In other aspects, a load lock module may be located between the end entry/exit station (similar to station 412) or the adjoining transport chamber module (similar to module 18i) may be configured to operate as a load lock. As also noted before, transport chamber modules 18B, 18i have one or more corresponding transport apparatus 26B, 26i, which may include one or more aspects of the disclosed embodiment described herein, located therein. The transport apparatus 26B, 26i of the respective transport chamber modules 18B, 18i may cooperate to provide the linearly distributed workpiece transport system 420 in the transport chamber. In this aspect, the transport apparatus 26B may have a general SCARA arm configuration (though in other aspects the transport arms may have any other desired arrangement such as a frog-leg configuration, telescopic configuration, bi-symmetric configuration, etc.). In the aspect of the disclosed embodiment shown in FIG. 1D, the arms of the transport apparatus 26B may be arranged to provide what may be referred to as fast swap arrangement allowing the transport to quickly swap wafers from a pick/place location as will also be described in further detail below. The transport arm 26B may have a suitable drive section, such as that described below, for providing each arm with any suitable number of degrees of freedom (e.g. independent rotation about shoulder and elbow joints with Z axis motion). As seen in FIG. 1D, in this aspect the modules 56A, 56, 30i may be located interstitially between transfer chamber modules 18B, 18i and may define suitable processing modules, load lock(s), buffer station(s), metrology station(s) or any other desired station(s). For example the interstitial modules, such as load locks 56A, 56 and workpiece station 30i, may each have stationary workpiece supports/shelves 56S, 56S1, 56S2, 30S1, 30S2 that may cooperate with the transport arms to effect transport or workpieces through the length of the transport chamber along linear axis X of the transport chamber. By way of example, workpiece(s) may be loaded into the transport chamber 416 by interface section 12. The workpiece(s) may be positioned on the support(s) of load lock module 56A with the transport arm 15 of the interface section. The workpiece(s), in load lock module 56A, may be moved between load lock module 56A and load lock module 56 by the transport arm 26B in module 18B, and in a similar and consecutive manner between load lock 56 and workpiece station 30i with arm 26i (in module 18i) and between station 30i and station 412 with arm 26i in module 18i. This process may be reversed in whole or in part to move the workpiece(s) in the opposite direction. Thus, in one aspect, workpieces may be moved in any direction along axis X and to any position along the transport chamber and may be loaded to and unloaded from any desired module (processing or otherwise) communicating with the transport chamber. In other aspects, interstitial transport chamber modules with static workpiece supports or shelves may not be provided between transport chamber modules 18B, 18i. In such aspects, transport arms of adjoining transport chamber modules may pass off workpieces directly from end effector or one transport arm to end effector of another transport arm to move the workpiece through the transport chamber. The processing station modules may operate on the substrates through various deposition, etching, or other types of processes to form electrical circuitry or other desired structure on the substrates. The processing station modules are connected to the transport chamber modules to allow substrates to be passed from the transport chamber to the processing stations and vice versa. A suitable example of a processing tool with similar general features to the processing apparatus depicted in FIG. 1D is described in U.S. patent application Ser. No. 11/442,511, previously incorporated by reference in its entirety.

The optimal commutation schemes described herein are schemes that provide approaches to computing currents in each phase of the brushless electrical machine so that one or more optimization criteria are accomplished. In the aspects of the disclosed embodiment the optimal commutation schemes may substantially maximize torque subject to certain constraints that will be described in greater detail below. The commutation schemes described herein may be applicable to any suitable motor type but are illustrated herein with respect to, for example, a variable reluctance motor for exemplary purposes. FIGS. 1E and 1F illustrate portions of a brushless electrical machine having a passive rotor in accordance with an aspect of the disclosed embodiment. The exemplary configuration of a direct drive brushless electrical machine illustrated in FIGS. 1E and 1F is representative of such machines having a rotary configuration, and used for convenience in describing aspects of the embodiment herein. It is noted that the aspects of the embodiment as described further below apply in a similar manner to a linear brushless electrical machine. In one aspect, as noted above, the brushless electrical machine having a passive rotor may be a variable or switched reluctance motor 100 connected to any suitable controller 400 which may be configured for controlling operation of the motor 100 as described herein. In one aspect, the controller 400 may have a distributed architecture substantially similar to that described in U.S. Pat. No. 7,904,182 entitled "Scalable Motion Control System", the disclosure of which is incorporated by reference herein in its entirety.

Here the variable reluctance motor 100 includes a housing 101, at least one stator 103 disposed within the housing and at least one rotor 102 corresponding to each of the at least one stator 103. Each of the at least one stator 103 may have any suitable number of salient (e.g. no magnets) stator poles 103P each having a motor winding or coil 104. Each of the at least one rotor 102 may also have any suitable number of salient rotor poles 102P so that the rotor is configured to form a closed magnetic flux circuit with the stator. For exemplary purposes only, the variable reluctance motor 100 is illustrated as a four phase motor having six rotor poles and eight stator poles but in other aspects the variable reluctance motor may have any suitable number of motor phases, any suitable number of rotor poles and any suitable number of stator poles. Here the at least one rotor 102 is disposed within or otherwise substantially surrounded by a respective stator 103 but in other aspects the stator may be disposed within or otherwise substantially surrounded by a respective rotor. Also, in this aspect the one or more stator/rotor pairs may be arranged in a stack (e.g. axially spaced next to each other along an axis of rotation of the variable reluctance motor 100) however, in other aspects the stator/rotor pairs may be arranged in a nested configuration where each stator/rotor pair is radially nested or otherwise substantially surrounded by another stator/rotor pair. The variable reluctance motor 100 may be configured for operation in atmospheric environments and/or vacuum environments where the stationary parts of the motor are isolated from the vacuum atmosphere as described in, for example, U.S. provisional patent application No. 61/903,813 entitled "Sealed Robot Drive" filed on Nov. 13, 2013, the disclosure of which is incorporated by reference herein in its entirety. The variable reluctance motor may also include features as described in U.S. provisional patent application No. 61/903,792 entitled "Axial Flux Motor" filed on Nov. 13, 2013, the disclosure of which is incorporated by reference herein in its entirety.

Figure 2:
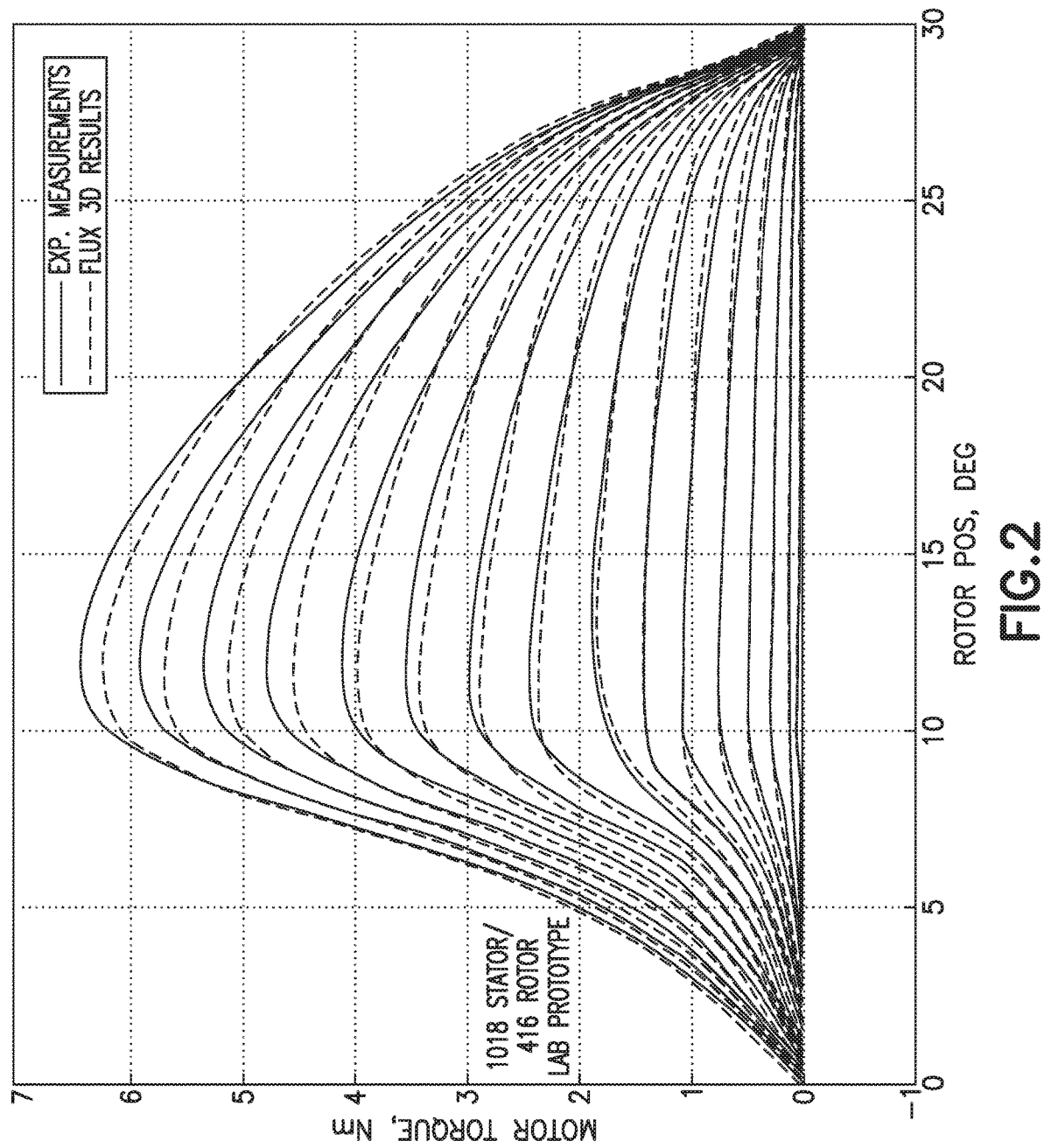
FIG. 2 illustrates an exemplary table in accordance with aspects of the disclosed embodiment.
Figure 3:
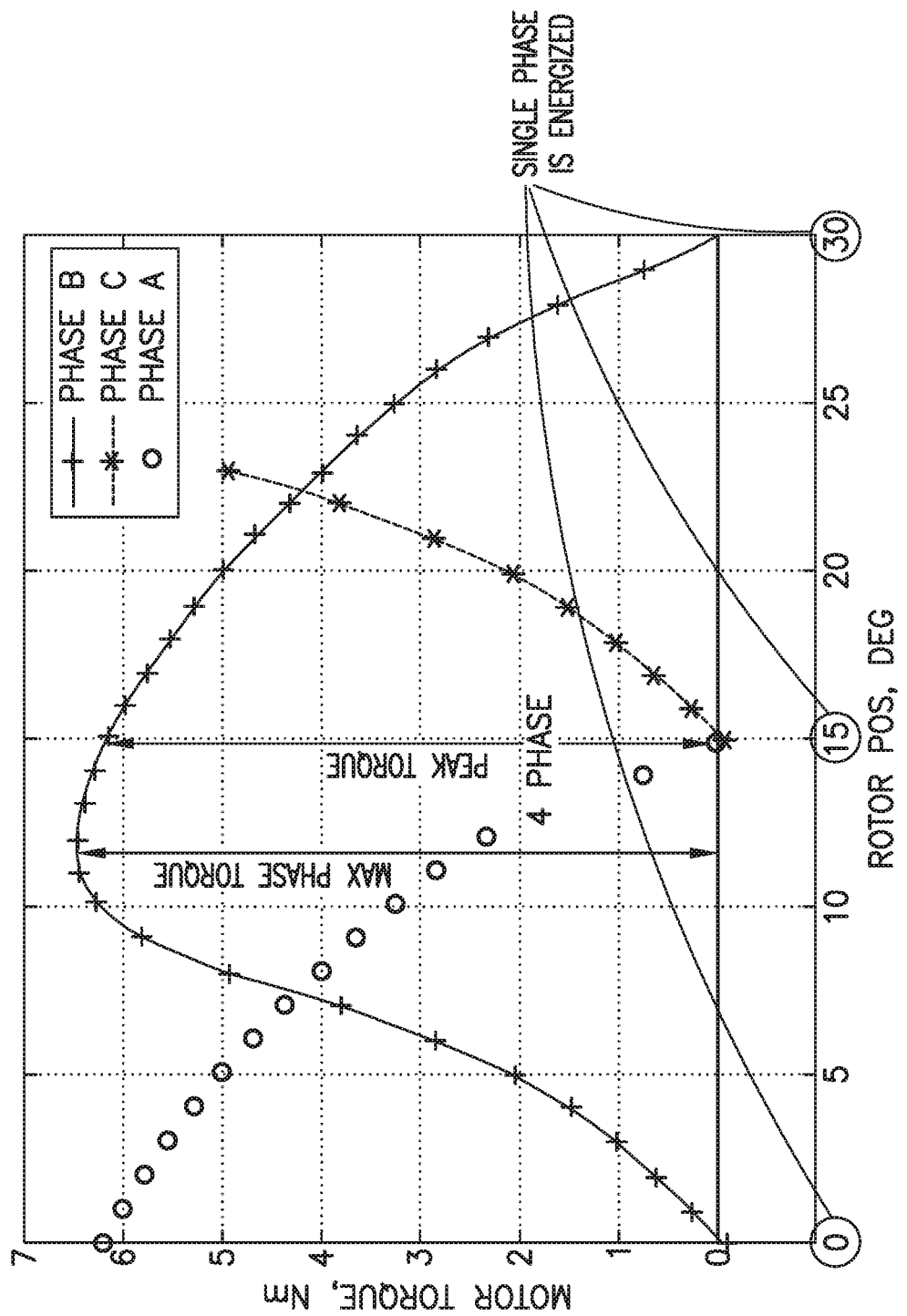
FIG. 3 illustrates another exemplary table in accordance with aspects of the disclosed embodiment.

As may be realized each of the at least one rotor 102 may be coupled to a respective drive shaft of any suitable drive shaft assembly 110. In this aspect the drive shaft assembly 110 is illustrated as a coaxial drive shaft assembly having two drive shafts but in other aspects there may be more or less than two drive shafts where each drive shaft corresponds to a respective rotor and stator pair (e.g. motor) of the brushless electrical machine. In still other aspects the drive shaft assembly may include individual drive shafts or coaxial drive shafts that are located side by side. As may be realized, the drive shaft assembly 110 may be connected to any suitable device, such as a robot transport device 111. The robotic transport device 111 may be for example, any suitable transport arm including but not limited to a bi-symmetric robot arm assembly, a SCARA type robot arm assembly, a telescoping robot arm assembly, a robot arm assembly having a lost motion switch or any other suitable robot arm assembly that includes one or more robot arms and utilizes a coaxial or side by side drive shaft. Referring now to FIGS. 2 and 3, respective torque versus position curves are illustrated for different current magnitudes across one single motor phase in accordance with aspects of the disclosed embodiment. In one aspect, also referring to FIGS. 1E and 1F, each motor phase may include two coils 104 wired in series and positioned diametrically opposite to each other, however in other aspects each motor phase may include any suitable number of coils wired in any suitable manner and located in any suitable position relative to one another. Generally, two of the motor phases may be energized to generate a desired or otherwise predetermined torque magnitude and direction except at, for example, electrical positions where only one motor phase contributes to the motor torque as shown in FIG. 3 where only a single motor phase is energized when, for example, the rotor is at about 0, 15 and 30 degrees. It should be understood that the rotor positions of about 0, 15 and 30 degrees are exemplary only and in other aspects the rotor positions where only a single motor phase is energized may be any suitable rotor positions which may depend on the number of stator and rotor poles and other motor configuration factors.

Generally several approaches have been proposed to define desired phase currents or a desired commutation strategy to achieve a desired amount of torque for any given time and rotor position. These approaches attempt to minimize torque ripple by assuming that each phase torque contribution can be independently quantified by measurements such as those illustrated in FIG. 2. However, these approaches generally neglect the effect of the neighboring phase once the neighboring phase gets energized. For example, the inductance of one of the active coils will change as the neighboring coil is energized. As such, the shape of the torque curve illustrated in, for example, FIGS. 2 and 3 may change depending on the current of the neighboring phase. Not considering the change in inductance of the active coil when a neighboring coil is energized may result in torque ripple of the variable reluctance motor 100.

Figure 4:
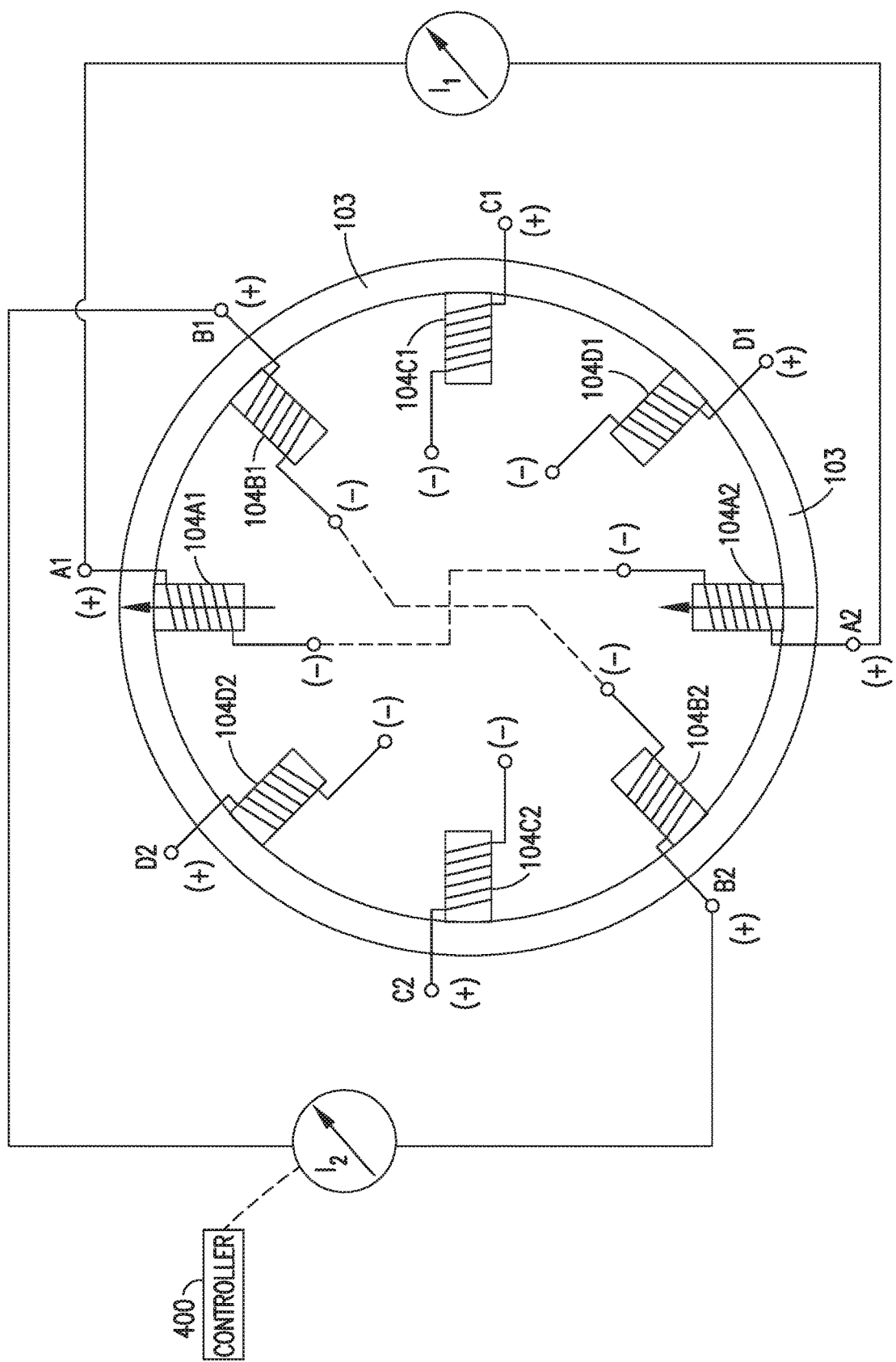
FIG. 4 is a schematic illustration of a portion of the variable reluctance motor shown in FIGS. 1E and 1F in accordance with aspects of the disclosed embodiment.
Figure 5:
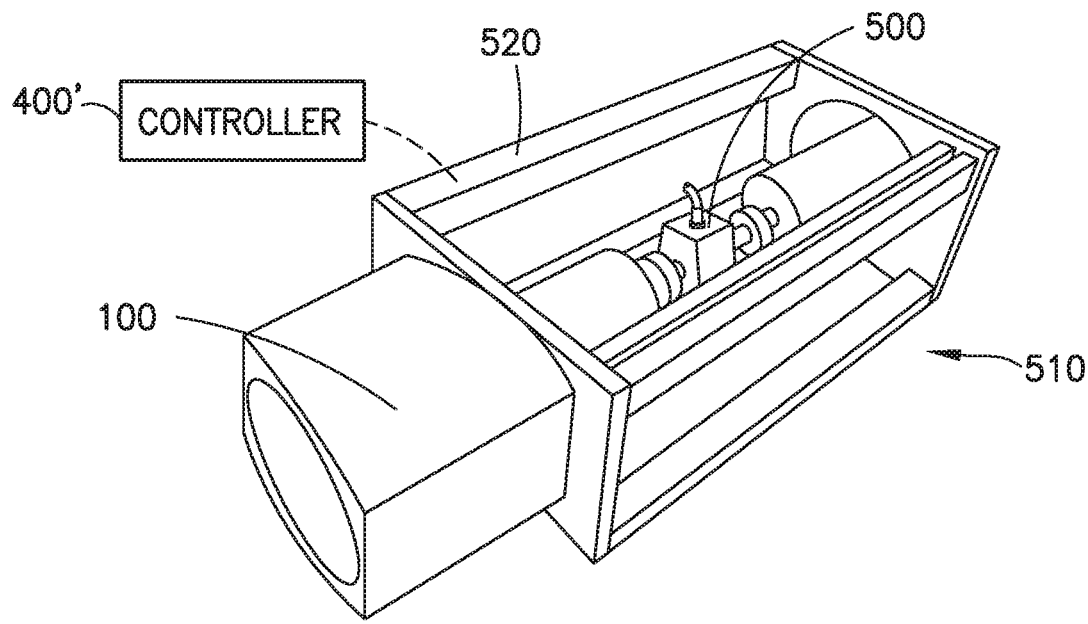
FIG. 5 is a schematic illustration of an iso-torque value generation station in accordance with aspects of the disclosed embodiment.
Figure 5A:
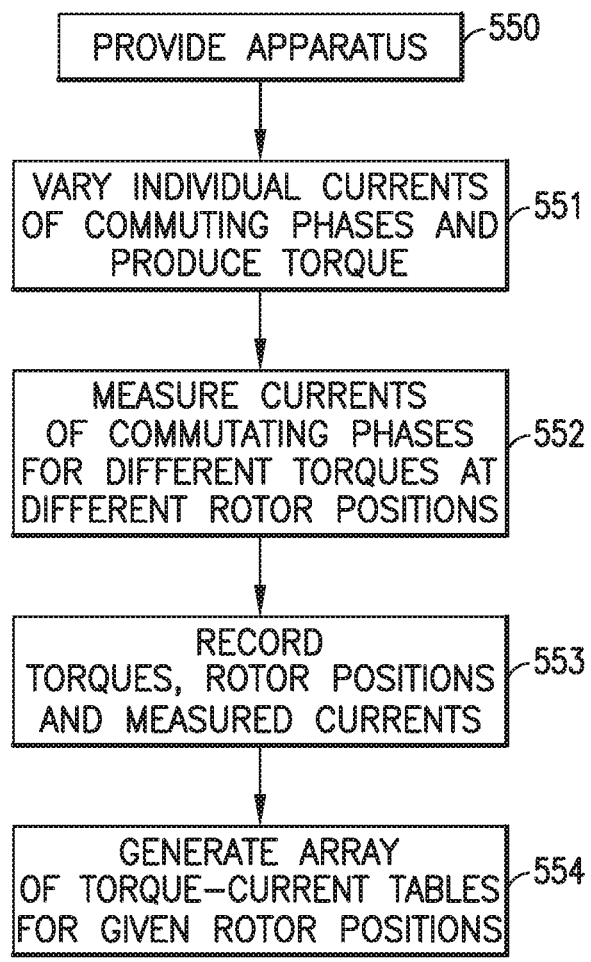
FIG. 5A illustrates a flow chart in accordance with aspects of the disclosed embodiment.

In one aspect of the disclosed embodiment an approach for obtaining a commutation strategy is provided that may naturally capture the effect of mutual inductance (e.g. the effect on inductance of one coil when an adjacent coil is energized) and as such, substantially minimizes the effect of torque ripple in the commutation of variable reluctance motors. Referring now to FIGS. 4 and 5, in one aspect the commutation strategy includes providing an apparatus, e.g. torque value generating station 510, to which the variable reluctance motor 100 is connected (FIG. 5A, Block 550). This station or apparatus provides a system for empirically characterizing the relationship between current, position and desired torque (or force) (e.g. rotational or linear motor arrangements as may apply) of the brushless electrical machine. The variable reluctance motor 100 may be run in any suitable manner at an array of phase currents (e.g. one or more phase commutating phase currents are varied to produce a predetermined torque) (FIG. 5A, Block 551) and/or an array of rotor electrical positions (e.g. the phase currents are measured for different torques at different rotor positions) (FIG. 5A, Block 552) that represent the operating range of the variable reluctance motor 100. The measured currents, torques and rotor electrical positions are recorded (FIG. 5A, Block 553) and torque curves (e.g. values) at the predetermined electrical positions and phase current combinations can be recorded and/or mapped by any suitable controller 400' (e.g. an array of torque-current tables for given rotor positions are generated) (FIG. 5A, Block 554). In one aspect the torque value generating station 510 may include any suitable frame 520 to which any suitable load cell 500 and the variable reluctance motor 100 are mounted. In one aspect the load cell 500 may be a static load cell. The variable reluctance motor 100 may be coupled to the load cell 500 in any suitable manner for providing operating resistance to the variable reluctance motor 100. The variable reluctance motor 100 and/or the load cell 500 may be communicably connected to, for example, controller 400' for operation of the variable reluctance motor 100 and recordation/mapping of the motor torque and more specifically, for any suitable number of position sufficient to describe the relation between the iso-torque curves, corresponding phase currents and rotor positions for a full rotor cycle or period (e.g. 360 degrees of electrical position). These values may be formatted, in any manner suitable for programming a controller, such as for example, a look up table as will be described further below. It is noted that in accordance with another aspect, the data or values characterizing the relationship between generated torque (force), current and position of the variable reluctance motor of desired form and characteristics may be generated using modeling techniques such as numerical methods or finite element modeling.

Figure 6:
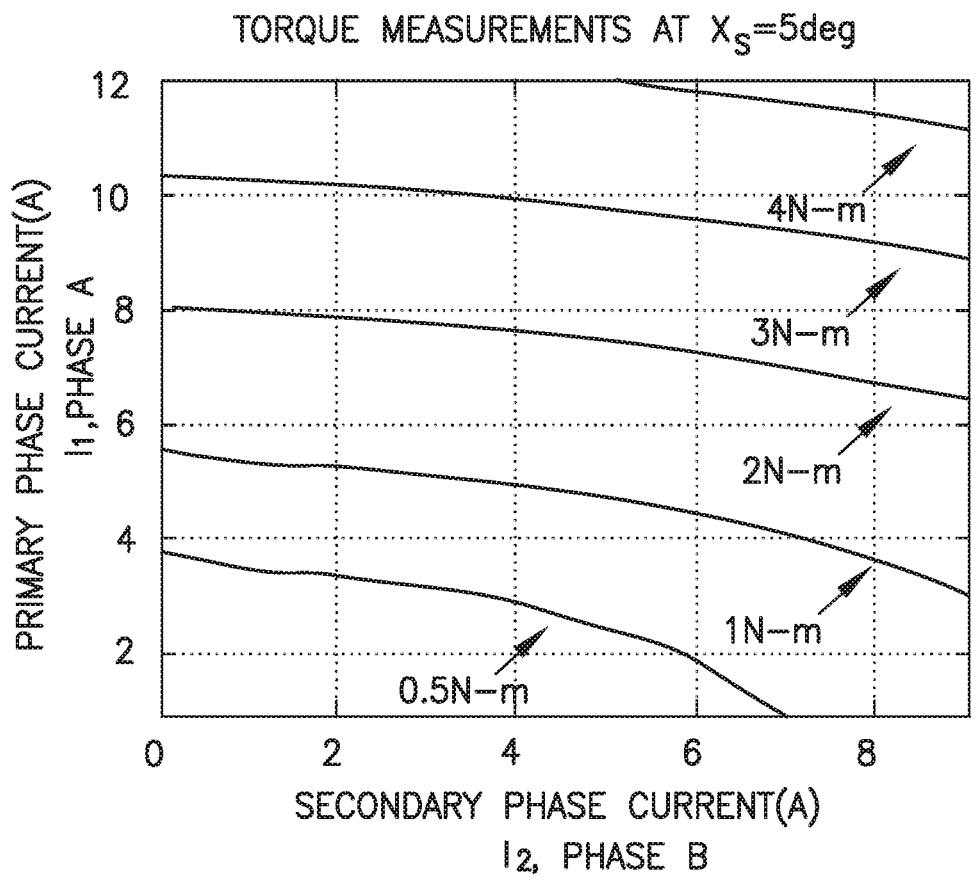
FIG. 6 illustrates a portion of an iso-torque curve table in accordance with aspects of the disclosed embodiment.

In this aspect a stator 103 of the variable reluctance motor 100 is shown in FIG. 4. Here the stator coils and an exemplary wiring of the stator coils are illustrated schematically and the rotor has been omitted for clarity. As described above, each motor phase A-D includes two diametrically opposed coils that are wired in series. For example, motor phase A includes coils 104A1 and 104A2, motor phase B includes coils 104B1 and 104B2, motor phase C includes coils 104C1 and 104C2 and motor phase D includes coils 104D1 and 104D2. Again, in other aspects the motor may have more or less than four phases arranged and wired in any suitable manner. The terminal leads of each motor phase may be wired to any suitable respective current source, such as for example $I_1$ and $I_2$ with respect to phases A and B. In one aspect each current source can be independently set (e.g. through any suitable controller 400') to generate a desired current through is respective phase. At a given rotor position, phases A and B are energized at predetermined currents and the load cell 500 registers the resultant static torque. At each rotor position and at a given current $I_1$ in phase A, the current $I_2$ in phase B is varied from, for example, about 0 to any suitable predetermined maximum current value. In one aspect the predetermined maximum current value may be a worst case operating range for the variable reluctance motor 100. This procedure (e.g. varying the phase B current for constant values of rotor position and phase A current) is repeated for an array of current $I_1$ and $I_2$ as well as an array of rotor electrical positions that, for example, represent an operating range of the variable reluctance motor 100. For example the operating range may be from about 0 to about 360 electrical degrees. At each point in the array, the static torque is measured and mapped with respect to the corresponding rotor electrical positions and corresponding phase current combinations to form an array of iso-torque curves (FIG. 5A, Block 553). As noted before, in other aspects the characterization data for the motor may be generated by modeling or simulation. An exemplary mapping or table of iso-torque curves (i.e. curves of constant torque at a given electrical position of the rotor) is illustrated in FIG. 6. It is noted that while iso-torque curves are described and shown herein the use of the term "curves" and the illustration thereof is for exemplary purposes only and in other aspects the iso-torque curves, which relate phase currents to torque and rotor position, can be represented in any suitable tabular form that includes phase current values, torque values and rotor position values. In FIG. 6 the iso-torque curves correspond to a rotor electrical position of 5 degrees but it should be understood that iso-torque curves may be generated for more than one electrical position of the rotor.

It is noted that the generation of the iso-torque tables described above is repeatable for any given motor or family of motors (e.g. two or more motors having substantially the same operating characteristics such as number of stator poles, number of rotor poles, air gap between the stator and rotor poles, etc.). As such, the iso-torque tables described above may be generated for any suitable motor having any suitable predetermined operating characteristics and the commutation schemes described herein with respect to the aspects of the disclosed embodiment may be applied to any of these suitable motors.

Figure 7:
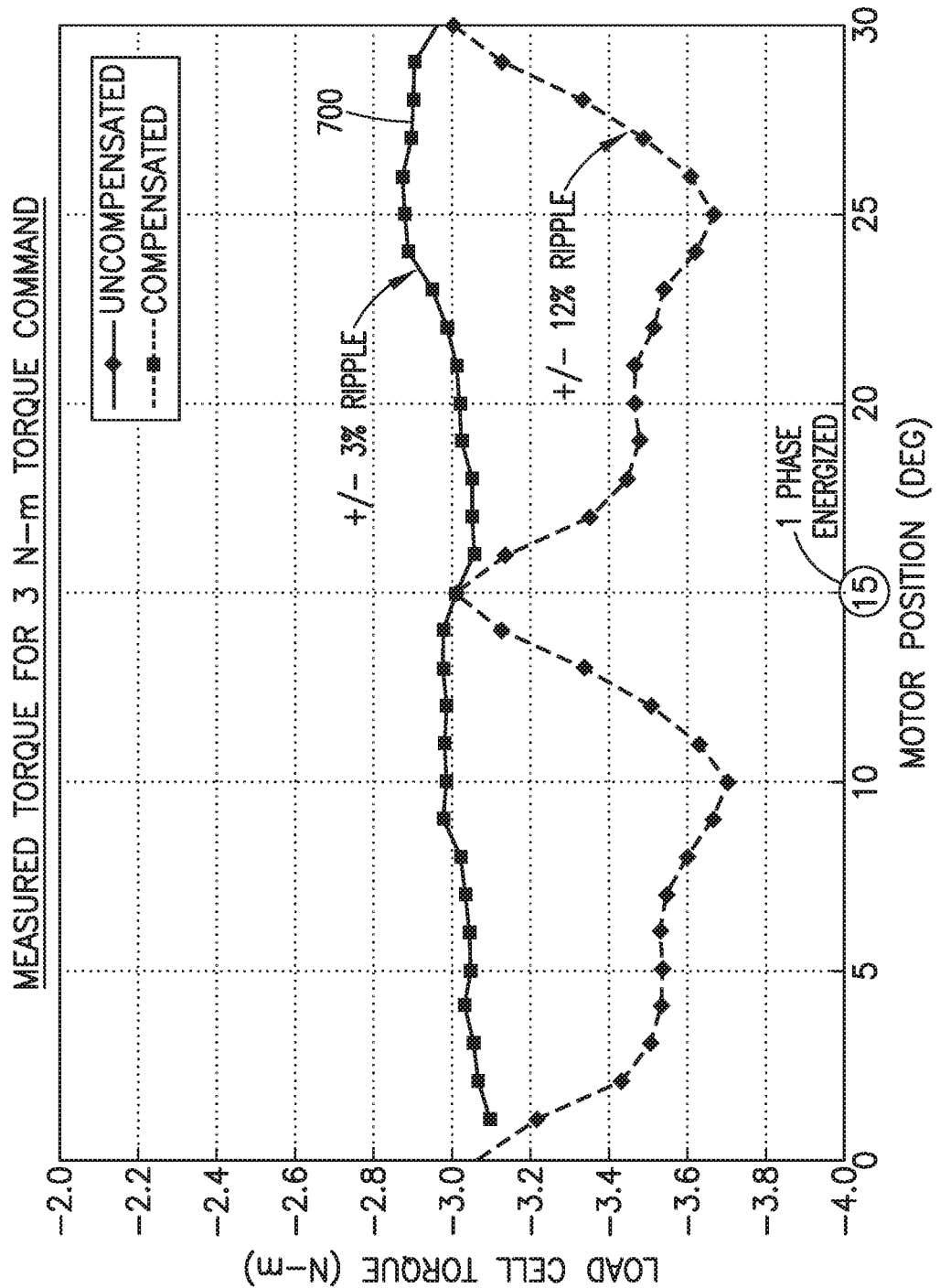
FIG. 7 illustrates an exemplary comparison table in accordance with aspects of the disclosed embodiment.

Referring again to FIG. 1E, the controller 400 may include a position control loop (FIGS. 12 and 13), described below, that may be configured to specify a desired or otherwise predetermined amount of torque at a given rotor electrical position and time. Any suitable commutation algorithm, such as those described below, may specify the current in one of the phases A-D. Tables such as those generated above, a portion of such table is shown in FIG. 6, may be resident in a memory accessible by or contained in the controller 400 for providing the controller 400 with a respective current of the additional phase. For example, the commutation algorithm may specify a phase current $i_1$ for phase A and the controller may be configured to obtain a respective phase current $i_2$ for phase B for any given torque and electrical angle of the rotor from the table so that the torque ripple of the variable reluctance motor is reduced. FIG. 7 illustrates an exemplary comparison plot of torque versus rotor position with respect to a conventional uncompensated torque ripple motor commutation and compensated torque ripple motor commutation (e.g. in accordance with aspects of the disclosed embodiment). As can be seen in FIG. 7, compensating for torque ripple (see curve 700) in accordance with aspects of the disclosed embodiment substantially reduces the effects of torque ripple (the nature of which comes from the mutual effect of adjacent phases being energized at the same time, as evidenced in FIG. 7 where the torque of both curves is equal when only one phase is energized).

Figure 8A:
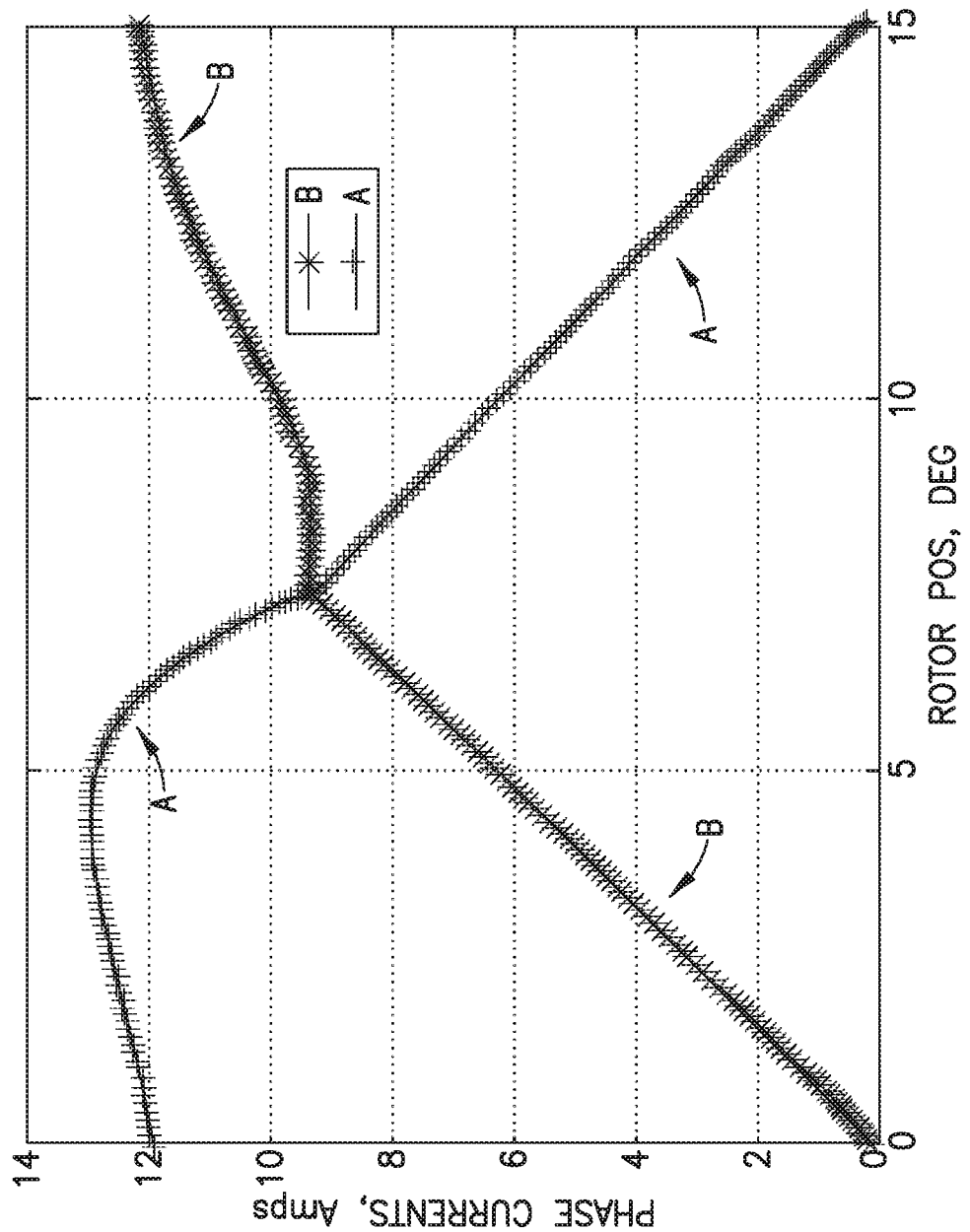

In accordance with aspects of the disclosed embodiment, referring again to FIGS. 1E and 1F and as described herein, the torque for the motor 100 may be a function of motor position as well as each of the phase currents. Also, there may not be a unique set of phase currents for a given torque (see for example, the table in FIG. 6) which illustrates a substantially infinite number of combinations of possible phase current values to achieve the given torque. Referring also to FIG. 8A an example of phase current variation is illustrated in phases A and B of, for example, the motor 100 at a constant torque. In the rotor position interval ranging from 0 to 15 degrees, only phases A and B are energized and the currents in phase C and D (see also FIG. 4) are substantially zero. Here phase A may be referred to as the dominant phase as it is driving the rotor 102 and phase B may be referred to as a latent phase whose current is increasing or ramping up to drive rotor as the rotor is moving between stator poles 103P. As the rotor pole passes the given stator pole 103P, phase B becomes the dominant phase and phase A becomes the latent phase such that the phase current in phase A decreases or ramps down. As can be seen in FIG. 8A, in one aspect, the ramping up and/or down of the phase currents when driving the rotor 102 may be provided as a linear shape function so that the change in current is linear. In other aspects, referring to FIG. 8B, another possible solution to the variation of phase currents is shown as a function of rotor position to yield a constant torque. Here the ramping up and/or down of the phase currents is provided as a quadratic shape function. As may be realized the ramping up and down of the phase currents may be provided as any suitable shape function. As may also be realized the shape function used to ramp up the phase current may be different from the shape function used to ramp down the phase current.

Still referring to FIGS. 4, 8A and 8B, as noted above, examples of phase current variation at a constant torque in phases A and B are illustrated as the rotor 102 spins from about to about 15 degrees. In other aspects the rotor may spin between any suitable angles or degree of arc. As also noted above, the phase current of phases C and D are substantially zero in this interval from about 0 to about 15 degrees. In one aspect, for the motor 100 the phase current signature may be periodic about every 15 degrees of rotor rotation and phase currents may be generated for a about 0 to about 15 degree interval of rotor rotation. As can be seen in the Figs. phases A and B are active in the about 0 to about 15 degree interval, and in the about 15 to about 30 degree interval phases B and C are active and so on. The profile of the current in phase B in the about 15 to about 30 degree interval may be substantially similar to that shown for phase A in FIGS. 8A and 8B (e.g. in the about 0 to about 15 degree interval) and the phase current in phase C in the about 15 to about 30 degree interval may be substantially similar to that shown for phase B in FIGS. 8A and 8B. As may be realized, substantially the same periodicity relationship applies to other phase pairs B-C, C-D and D-A as the rotor spins. In other aspects any suitable periodicity relationship(s) may be provided for the phase pairs. In this aspect, at any given rotor position, at most two phases are active and at every about 15 degree interval, one of the phases becomes inactive and a new phase becomes active.

In one aspect the commutation schemes described herein may use one or more torque tables such as those described above with respect to FIG. 6, which tabulate motor torque as a function of phase currents $i_A$ and $i_B$ and motor position $\theta$ for any suitable rotor interval, such as the about 0 to about 15 degree interval noted above. In one aspect the torque table may be represented analytically as $$T = T(\theta, i_A, i_B) \quad [1]$$

where the torque T is position dependent. In other aspects, the torque table may be experimentally measured (e.g. as described above with respect to torque curve generation station 510). In still other aspects the torque tables may be computed through, for example, finite element analysis of a motor model. In yet other aspects the torque tables may be generated in any suitable manner. It is noted that while the commutation schemes described herein will be described with respect to the about 15 degree interval noted above, in other aspects the commutation schemes described herein may be applied to any suitable interval.

With respect to the about 15 degree periodicity (which in other aspects may be any suitable interval) appropriate boundary conditions for the phase currents $i_A$ and $i_B$ may be established such as $$i_A = 0 \text{ at } \theta = 15 \text{ deg} \quad [2]$$

and $$i_B = 0 \text{ at } \theta = 0 \text{ deg} \quad [3]$$

To solve for the two phase currents shown in, for example, FIGS. 3A and 3B the about 15 degree interval may be divided substantially in half or into sub-intervals, one half being from about 0 to about 7.5 degrees and the other half being from about 7.5 to about 15 degrees. In each of the sub intervals one of the phase currents is defined by, for example, any suitable shape function as described above and the remaining phase current may be determined from, for example, any suitable torque table such as that shown in FIG. 6.

Figure 9B:
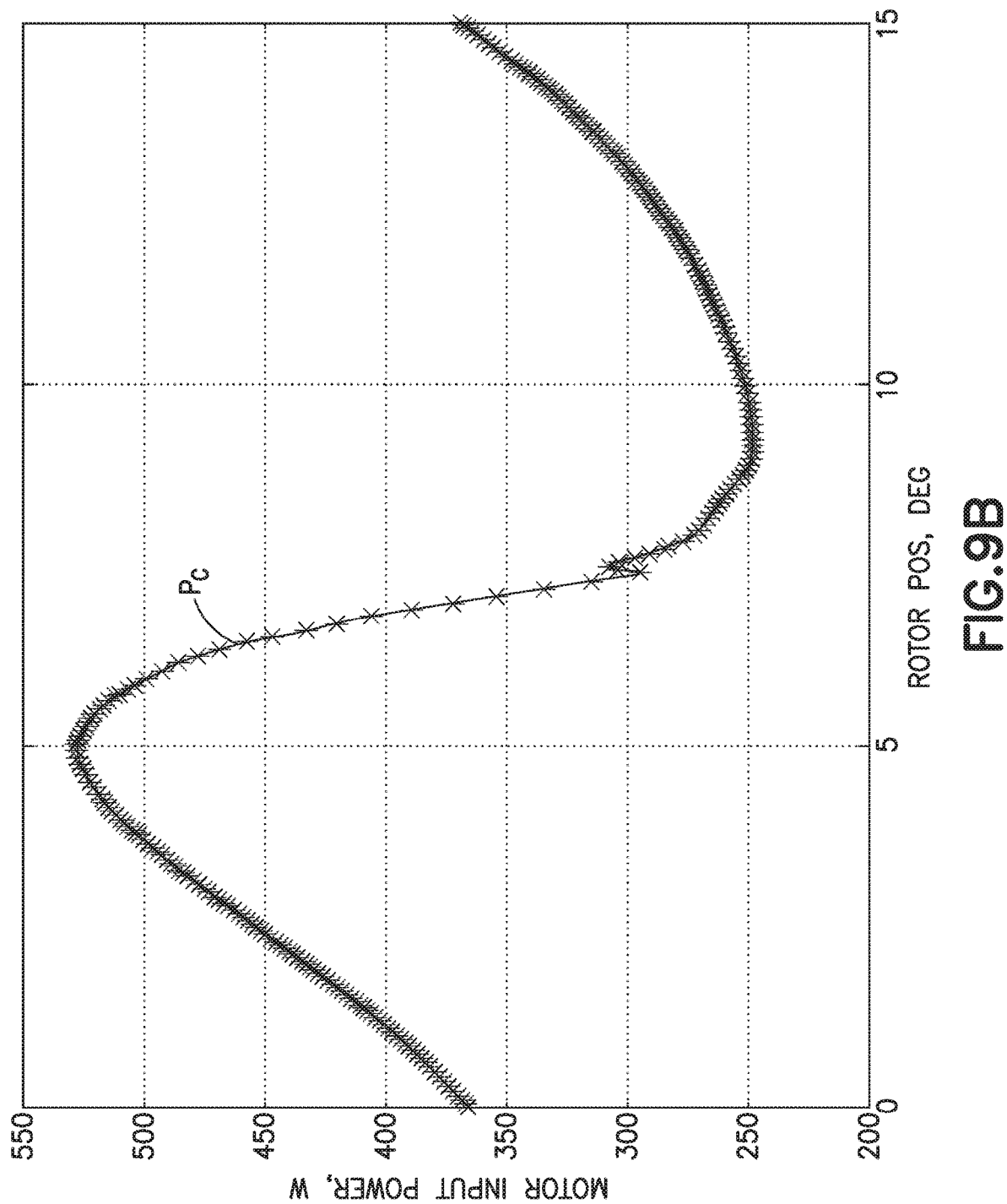

Referring to FIGS. 9A and 9B, the total electrical power consumed Pc by the energized phases (in this example phases A and B are energized) is illustrated as the rotor spins at any suitable rpm which, for exemplary purposes in this example, is about 60 rpm. The power curve in FIG. 9A corresponds to the phase currents in FIG. 8A and the power curve in FIG. 9B corresponds to the phase currents in FIG. 8B. Here, for exemplary purposes, a constraint may be placed on the available power of the motor such that the available power is about 540 W. In other aspects the power may be constrained to any suitable value such as, for example, the power rating of the motor being commutated by the schemes described herein. The torque may be adjusted such that the peak power consumption falls below the about 540 W power constraint. As can be seen in FIGS. 9A and 9B, in this example, at about 60 rpm the torque corresponding to the power constraint of about 540 W is about 7.1 Nm for the linear shape function of FIG. 8A and about 7.2 Nm for the quadratic shape function of FIG. 8B. It is noted that, in one aspect, the slope of the shape functions may also be constrained, such as with respect to a voltage of the bus supplying power to the phases as will be described below.

In one aspect of the disclosed embodiment, an approach to determining phase currents that maximize motor torque for a given limit on input power may be provided where the shape functions described above with respect to FIGS. 8A and 8B are replaced with a constraint(s) on motor power consumption. In general, the voltage drop across a single phase of the motor may be written as $$V = Ri + \frac{d\lambda(\theta, i)}{dt} \quad [4]$$

where V is the voltage across the phase, i is the phase current, R is the phase resistance and $$\frac{d\lambda(\theta, i)}{dt}$$

is the flux linkage rate in terms of motor angular position $\theta$ and current i.

Also, $$\lambda(\theta, i) = L(\theta, i)i \quad [5]$$

where $L(\theta, i)$ is the inductance. As such, the voltage across the phase can be rewritten as $$V = Ri + \frac{d\lambda}{d\theta}\dot{\theta} + \frac{d\lambda}{di}\frac{di}{dt} \quad [6]$$

and multiplying both sides of equation [6] by the current i yields the power equality $$Vi = Ri^2 + \frac{d\lambda}{d\theta}\dot{\theta}i + \frac{d\lambda}{di}\frac{di}{dt}i \quad [7]$$

As such, based on e.g. equation [7] the constraint on the motor power consumption or total power can be written in terms of phase currents $i_A$ and $i_B$, phase resistance R, and flux linkage $\lambda_A(i_A, \theta)$ and $\lambda_B(i_B, \theta)$ respectively as $$i_A^2 R + i_B^2 R + i_A \frac{d\lambda_A}{di_A}\frac{di_A}{dt} + i_B \frac{d\lambda_B}{di_B}\frac{di_B}{dt} + T\dot\theta < P_{max} \qquad [8]$$

where "T$\dot\theta$" represents the mechanical power output of the motor (T is the motor torque and $\dot\theta$ is the angular velocity), $i_A^2 R$ and $i_B^2 R$ represent the resistive power loss in the motor windings or coils and $$i_A \frac{d\lambda_A}{di_A}\frac{di_A}{dt} \text{ and } i_B \frac{d\lambda_B}{di_B}\frac{di_B}{dt}$$

represent the magnetic field energy stored in the motor. It is noted that in one aspect the torque may be specified by, for example, kinematic analysis of the transport device 111 (FIG. 1) as described in International Application Number PCT/US2012/052977 (WO publication number 2013/033289) entitled "Time-Optimal Trajectories for Robotic Transfer Devices" and filed on Aug. 30, 2012 and U.S. patent application Ser. No. 13/614,007 entitled "Method for Transporting a Substrate with a Substrate Transport" and filed on Sep. 13, 2012 the disclosures of which are incorporated herein by reference in their entireties. In other aspects the torque (and/or the angular velocity) may be obtained by motor sensors in real time and the power may be adjusted by, for example, controller 400 so that the total power remains substantially below $P_{max}$. Given the torque of the motor, the phase currents $i_A$ and $i_B$ can be determined from the iso-torque tables described above. In other aspects the phase currents can be determined in any suitable manner. In one aspect, the constraint equation [8] can be combined with the iso-torque tables and the phase current boundary conditions of equations [2] and [3] to determine the phase currents $i_A$ and $i_B$ (or any other suitable phase currents for the phase current pairs noted above) in, for example, the about 0 to about 15 degree rotor position (or any other suitable rotor position).

In another aspect of the disclosed embodiment, an approach to determining phase currents that maximize motor torque for a given limit on input power may be provided where the shape functions described above with respect to FIGS. 8A and 8B are replaced with a constraint(s) on phase voltage $V_{bus}$. For example, given the voltage across the phase as described above in equation [6] a constraint on voltage in each of the phases (e.g. in this example phases A and B) can be written as $$i_A R + \frac{d\lambda_A}{d\theta}\dot\theta + \frac{d\lambda_A}{di_A}\frac{di_A}{dt} < V_{bus} \text{ and} \qquad [9]$$

$$i_B R + \frac{d\lambda_B}{d\theta}\dot\theta + \frac{d\lambda_B}{di_B}\frac{di_B}{dt} < V_{bus} \qquad [10]$$

where $$\frac{d\lambda}{d\theta}\dot\theta \text{ and } \frac{d\lambda}{di}\frac{di}{dt}$$

can be determined from, for example, the iso-torque tables, motor models, empirically, from motor sensors or in any other suitable manner. In one aspect, the constraint equation [8] can be combined with the iso-torque tables and the phase current boundary conditions of equations [2] and [3] to determine the phase currents $i_A$ and $i_B$ (or any other suitable phase currents for the phase current pairs noted above) in, for example, the about 0 to about 15 degree rotor position (or any other suitable rotor position). In one aspect, the constraint equations [9] and [10] can be combined with the iso-torque tables and the phase current boundary conditions of equations [2] and [3] to determine the phase currents $i_A$ and $i_B$ (or any other suitable phase currents for the phase current pairs noted above) in, for example, the about 0 to about 15 degree rotor position (or any other suitable rotor position).

Figure 10A:
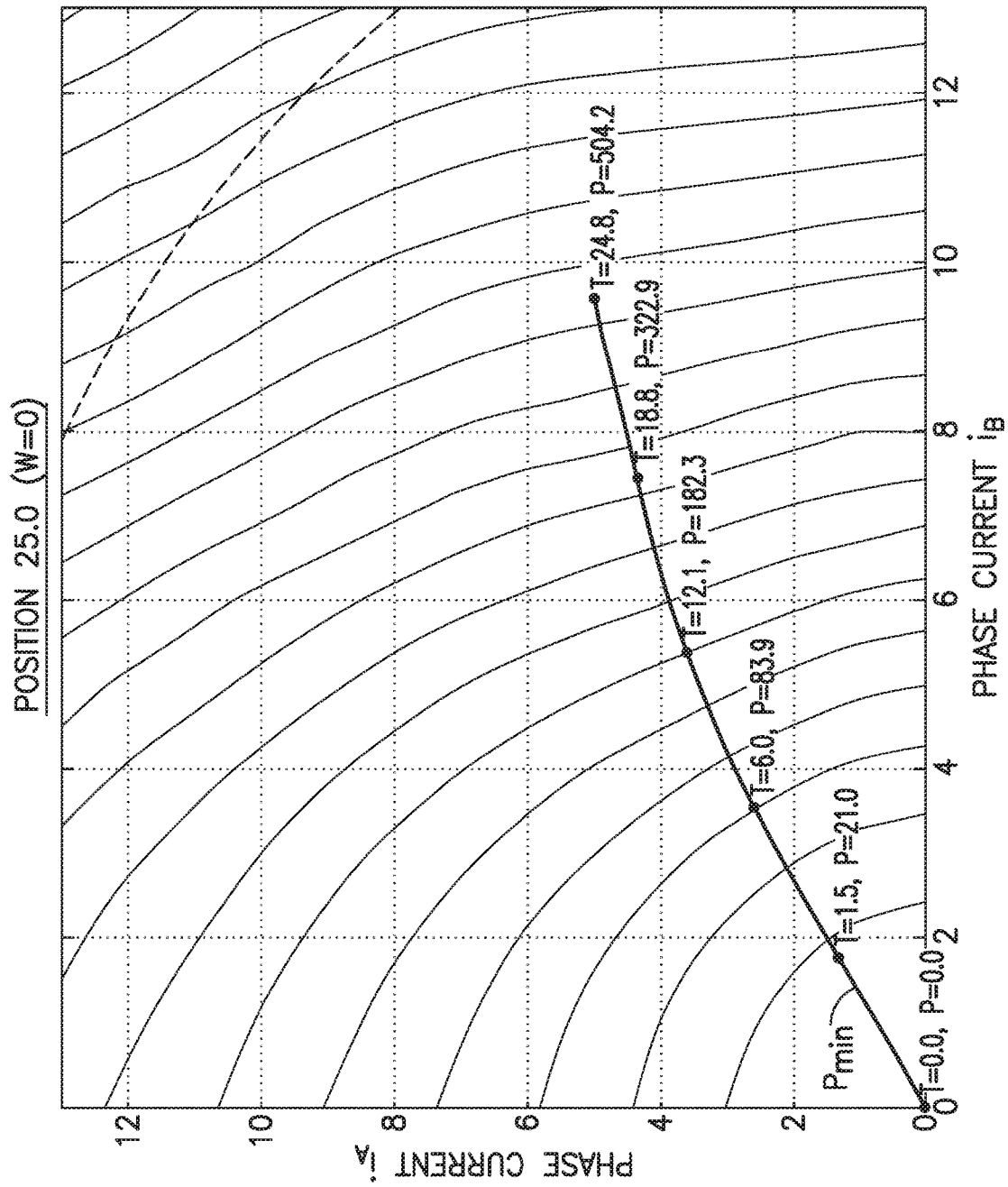

In one aspect of the disclosed embodiment a further commutation scheme may be provided where a minimum power $P_{min}$ is achieved as described below. Here a desired torque is known from, for example, the position control loop of the transport device 111 (FIG. 1) as noted above. Referring to FIGS. 10A and 10B, iso-torque tables (which are substantially similar to those described above) may be used to determine the phase currents, such as $i_A$ and $i_B$, in any suitable manner for a given torque and motor rotor position. For example, in one aspect a unique set of phase currents $i_A$ and $i_B$ (see also FIG. 6) can be identified along the desired iso-torque line such that the a minimum dissipative power is achieved within the phases A and B. In other aspects the minimum power $P_{min}$ may be determined through numerical analysis, empirically, etc.). Once the minimum power is achieved the correspondent phase currents $i_A$ and $i_B$ can be recorded, such as for example into a table for the given desired torque and at the respective rotor position. Equations [9] and [10] above may be used to verify that the phase currents $i_A$ and $i_B$ associated with $P_{min}$, for a given torque and torque position can comply with the constraint imposed by the bus voltage $V_{bus}$.

In another aspect of the disclosed embodiment, a real time comparator commutation scheme may be used to operate the motor 100. For example, the controller 400 may include a current feedback loop that accounts for the changes of the coil inductance during real time operation of the motor 100. This current feedback loop may allow for torque compensation that addresses the effects of torque ripple in the motor 100. For example, referring to FIGS. 12 and 13 the controller 400 may include a memory 400M, a position loop module 1200, a commutation loop module 1201, a current loop module, a torque ripple estimator, and an inductance model module. The motor 100 may include a motor phase plant module 100M1 and a motor magnetic circuit plant module 100M2. Here, for example, the desired trajectory and actual state feedback are input into the position loop module 1200 which is configured to calculate the desired torque to be applied by the motor 100. The desired torque is input into the commutation loop module 1201 which may be configured to use the actual position and velocity of the motor (as determined by, e.g., motor sensors) to calculate the desired phase currents to be imposed in the motor 100. The desired phase currents are input into the current loop module 1202 which may employ the actual phase current as feedback to calculate the phase voltage at the terminals of the respective coils 104 of the motor 100.

The inductance model module 1204 (in which the inductance model can be represented as $$\frac{d\lambda}{di} = L(\theta, i))$$

may be configured to account for changes in the inductance of the motor 100 in terms of, for example, the motor's actual position and actual phase current so that the current loop module can better utilize its control gains for a more realistic inductance and better cope with the large variation in the inductance that exist in a variable reluctance motor. As may be realized, the phase voltage generated by the current loop module 1202 may result in some torque ripple. To attenuate this torque ripple a phase voltage correction signal may be applied to the phase voltage. The torque ripple estimator 1203 may use one or more of an estimated inductance, the actual phase current, the flux linkage rate, the actual position, actual velocity, and desired torque to calculate in real time the appropriate phase voltage correction that will result in a reduction of the torque ripple in the output of the motor magnetic circuit 100M2 where the actual torque is generated.

Figure 11A:
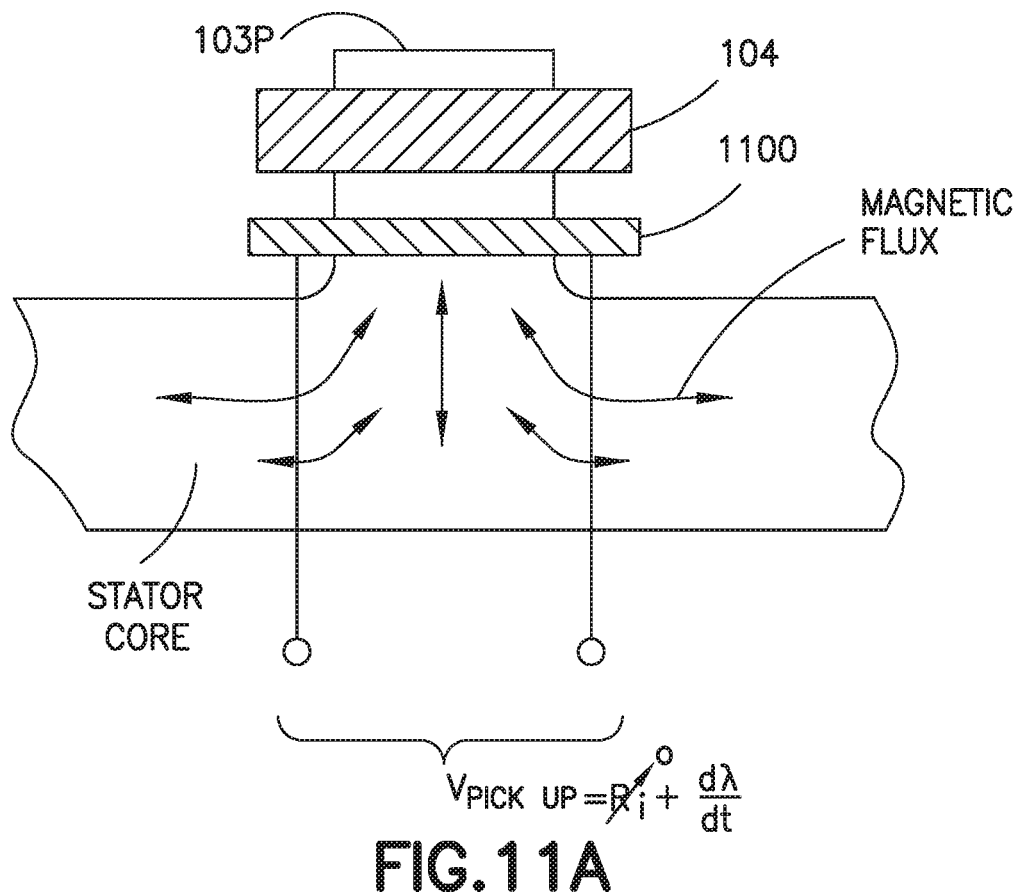
FIGS. 11A and 11B are schematic illustrations of a portion of a variable reluctance motor in accordance with aspects of the disclosed embodiment.
Figure 11B:
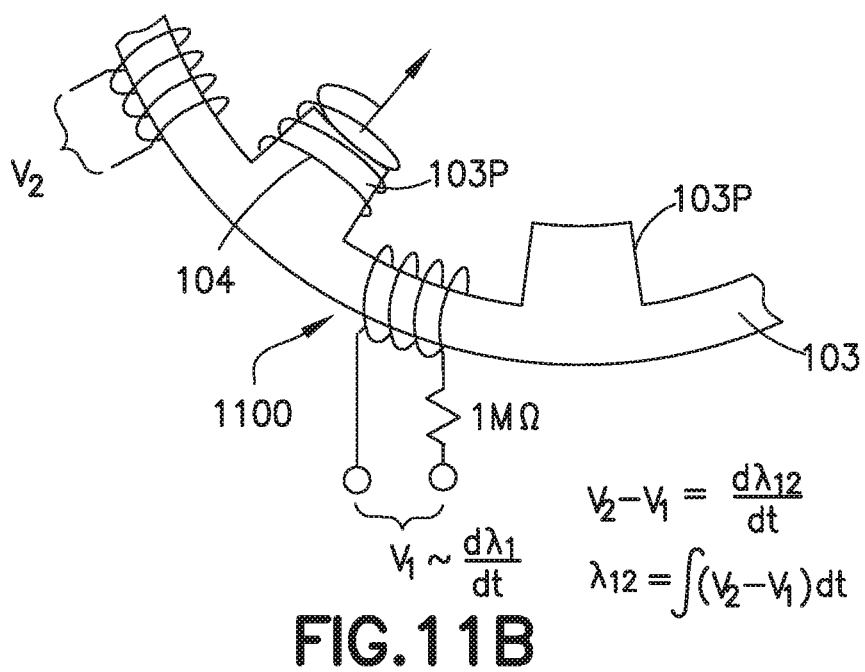

The flux linkage rate (which can be written as $$\frac{d\lambda}{dt})$$

used by the torque ripple estimator may be measured in any suitable manner such as with the sensor or pick up coil 1100 shown in FIGS. 11A and 11B, which may be located on or adjacent the respective coil. In other aspects the sensor 1100 may be located at any suitable position for measuring the flux linkage. The sensor 1100 may be an independent coil positioned such that as the phase coil 104 is energized (e.g. as a result of commutation) the magnetic flux linkage generated within the stator pole 103P is induced in the sensor 1100. The rate of change of the flux linkage with the resistance, current and terminal voltage across the sensor 1100 coil is defined by equation [4] above. By connecting the sensor 1100 to a high impedance channel (such as an analog to digital converter or any other suitable high impedance channel) the associated current can be neglected and what remains is the terminal voltage (see equation [11] below) that is a substantially direct measurement of the rate of change of flux linkage across the stator pole.

Each motor phase may have its own sensor 1100 configured to provide a flux linkage rate for each rotor position.

$$V = \frac{d\lambda}{dt} \quad [11]$$

It is noted that the torque ripple compensation performed by the torque ripple estimator includes the ability to have an indirect measure of the actual torque generated by the motor output. This indirect measure of the actual torque is compared against the desired torque so that the torque ripple estimator can calculate the phase voltage correction that will cause the actual torque to approach the desired torque. The indirect measure of the actual torque can be derived from the following equation $$\frac{d\lambda}{d\theta}\theta i = \text{Torque } x\theta \quad [12]$$

Using equation [12] and the partial derivative of the flux linkage (see equation [5] above) the indirect measure of the actual torque can be calculated from the following equation $$\text{Torque} = \left(\frac{d\lambda}{dt} - \frac{d\lambda}{di}\frac{di}{dt}\right)\frac{i}{\dot{\theta}} \quad [13]$$

where the flux linkage $$\frac{d\lambda}{dt}$$

is measured as described above (see equation [11]), the inductance $$\frac{d\lambda}{di} = L(\theta, i)$$

is determined with a lookup table, a model, empirically or in any other suitable manner and the expression $$\frac{i}{\dot{\theta}}$$

can be calculated from, for example, the current and velocity feedback or in any other suitable manner.

Figure 12:
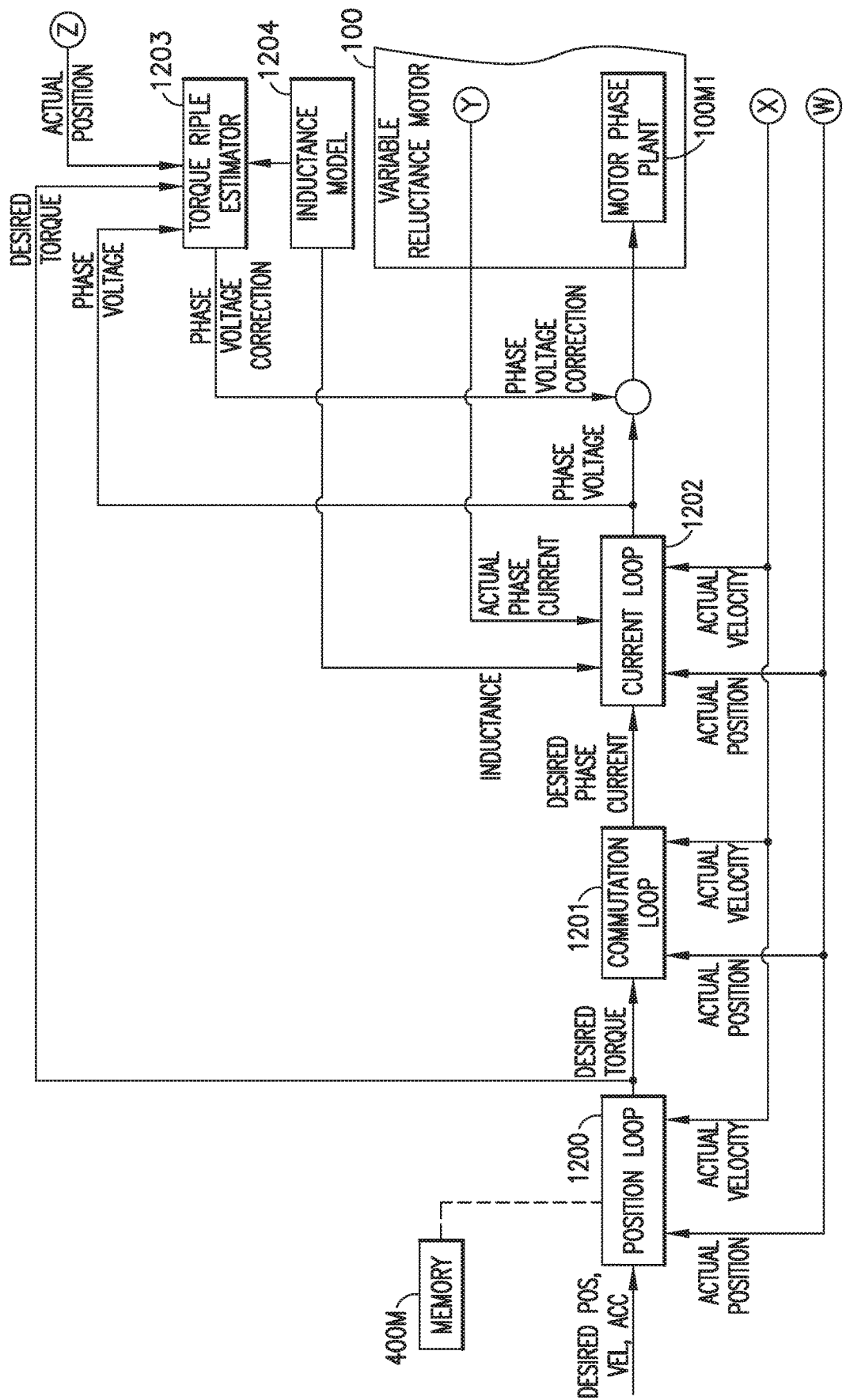
FIGS. 12 and 13 illustrate a schematic diagram of a transport apparatus and control system therefor in accordance with aspects of the disclosed embodiment.
Figure 13:
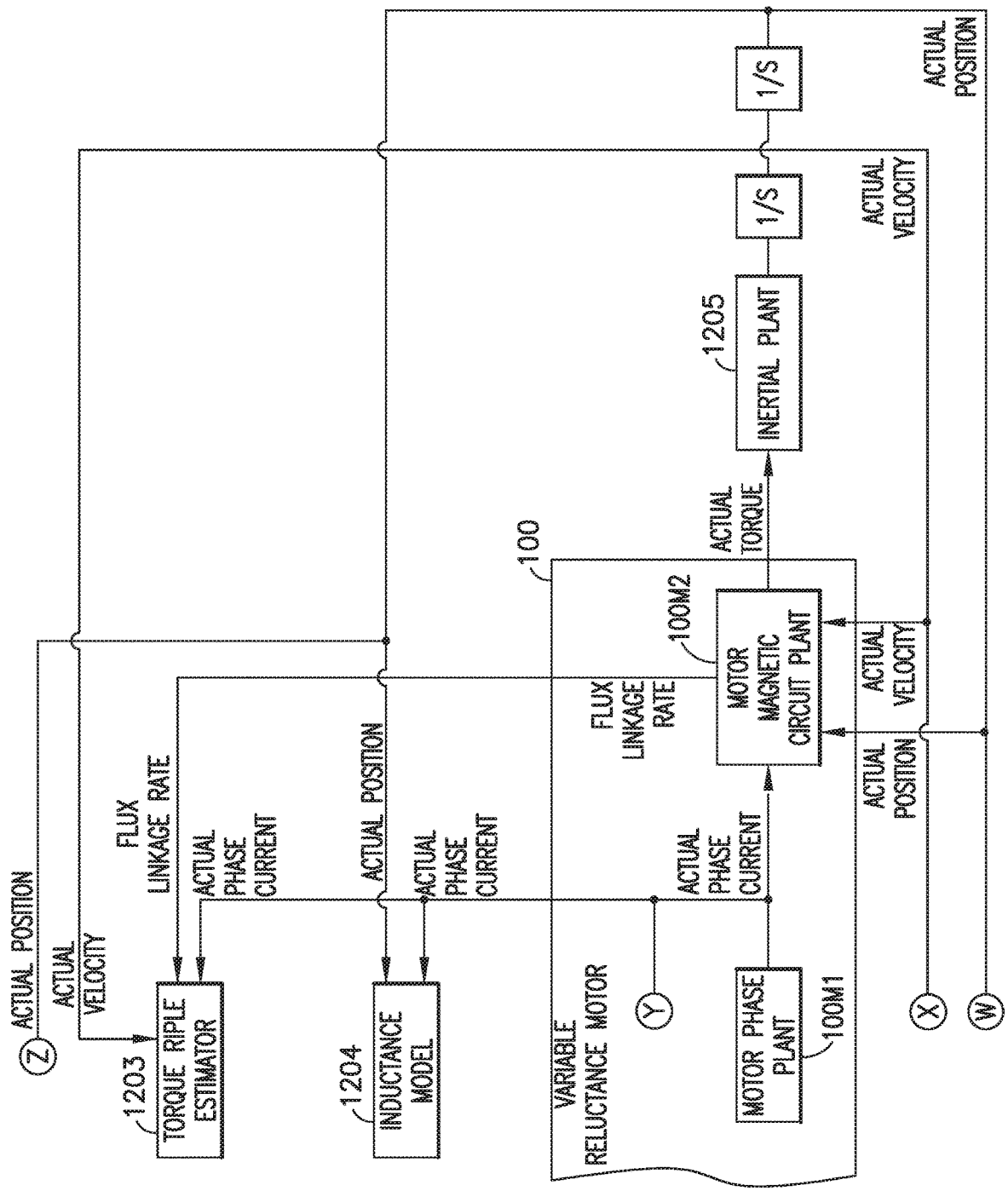

A resultant phase current can be generated from the modified phase voltage (e.g. the phase voltage modified after the phase voltage correction is applied by the torque ripple estimator 1203) which in turn can be used to generate the actual torque provided by the motor magnetic circuit 100M2. The inertial plant 1205 (which may be substantially similar to the transport device 111 described above) reacts to the actual torque applied by generating the respective acceleration, velocity and position of the inertial plant 1205. The acceleration, velocity and position states of the inertial plant are then fed back to the appropriate control loop modules as shown in FIGS. 12 and 13.

Figure 14:
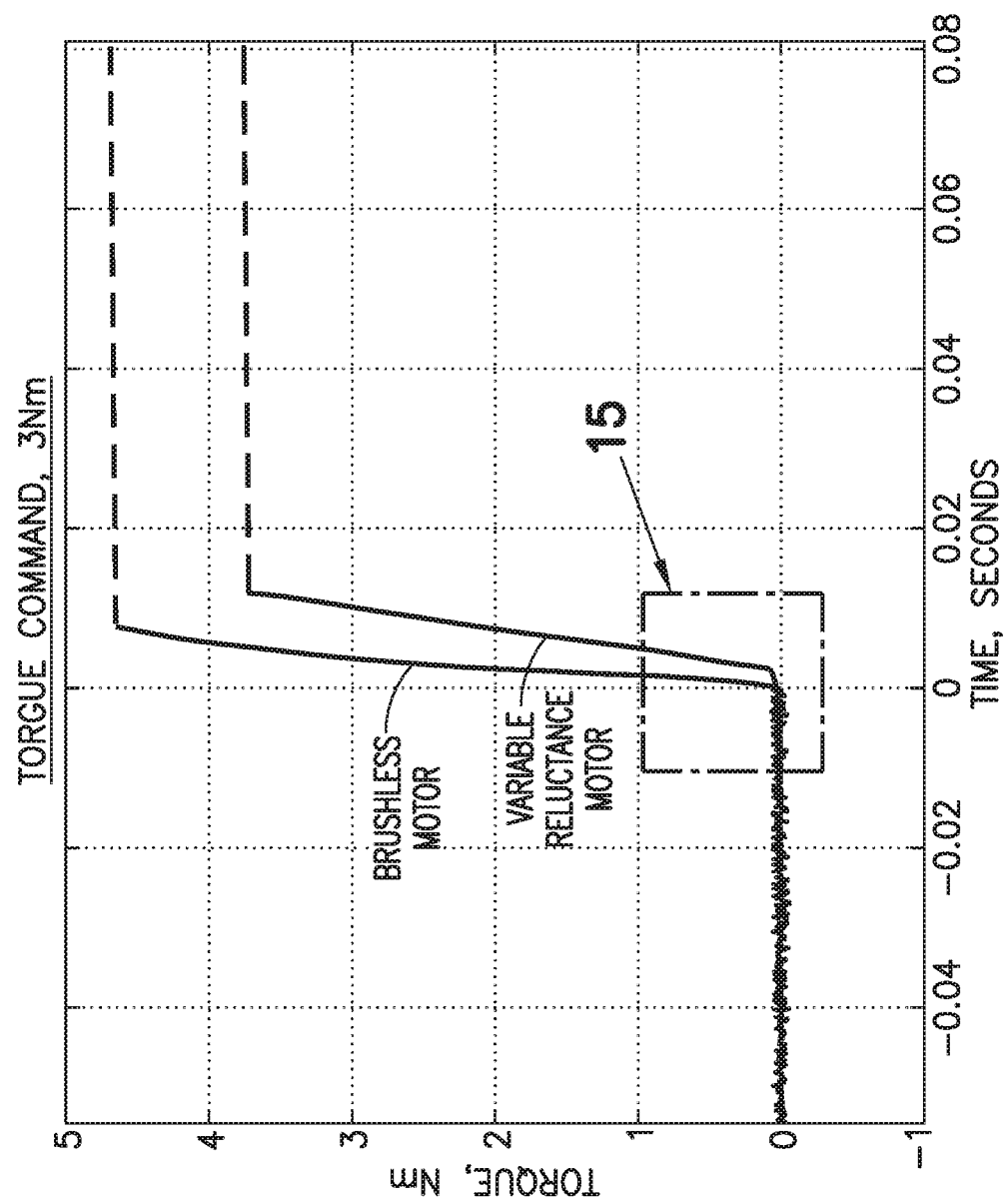
FIGS. 14 and 15 illustrate exemplary comparison tables in accordance with aspects of the disclosed embodiment.
Figure 15:
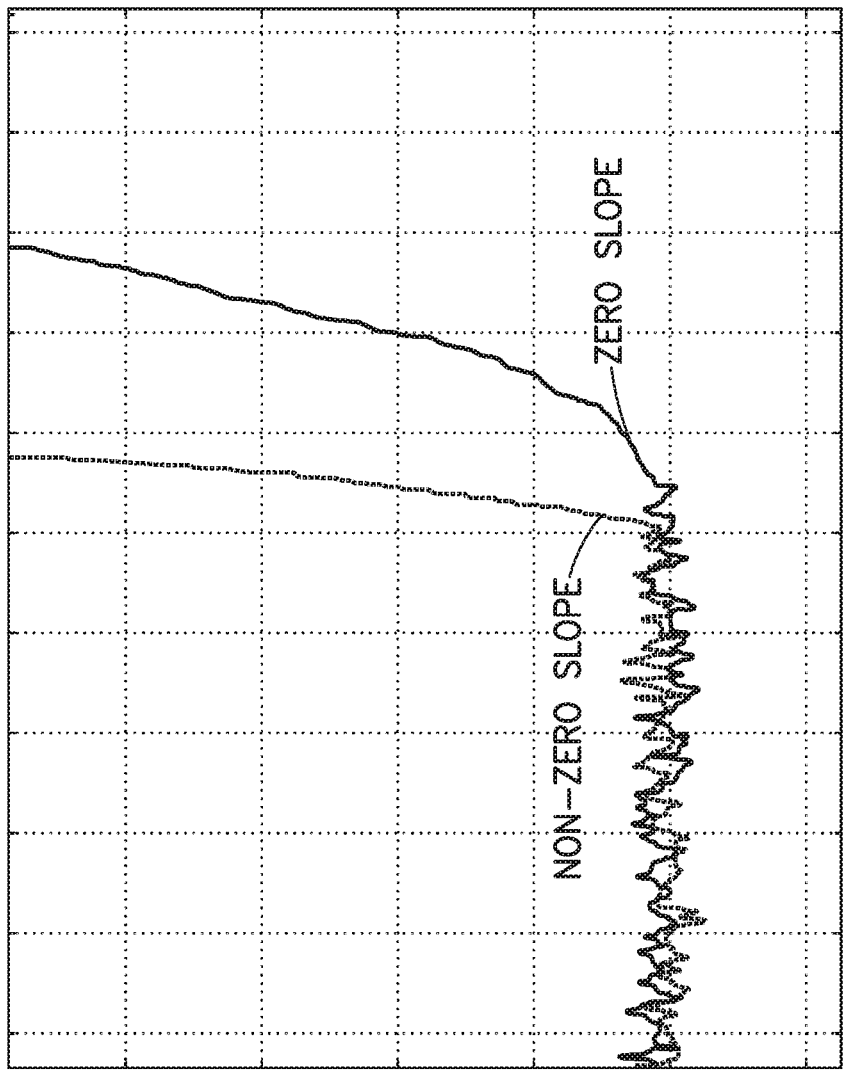

In the aspects of the disclosed embodiments described herein the torque-current-position relationship reflects motor torque as a function of motor position and phase currents under, for example, steady state conditions where a desired torque and rotor position are fixed in time. If the torque or rotor position where to vary with time, as is the case in a robotic application, the validity of using static torque relationships may be determined by the speed of response of the motor dynamics. A measure of the motor dynamics is the speed of torque step response of the motor. FIG. 14 illustrates a torque output of a brushless DC motor commanded to a torque of about 3 Nm. The motor torque step response (e.g. dynamic response time) may be measured in any suitable manner. FIG. 14 also illustrates the torque step response of a variable reluctance motor (with a similar form factor to the brushless DC motor). It can be seen in FIGS. 14 and 15 that the brushless DC motor has a faster response time than the variable reluctance motor. It is noted that the torque curve in a variable reluctance motor may begin with a substantially zero slope while the torque curve on the brushless DC motor may begin with a non-zero slope. This is because in a switched reluctance motor the torque-current relationship is quadratic while the torque-current relationship in the brushless DC motor is linear. Thus, it is expected that in comparison to the brushless DC motor, the conventional switched reluctance motor may have an inherently slow response time in the vicinity of zero currents and torques. In one aspect of the disclosed embodiment the system and method (such as may be embodied in a suitable algorithm) allows for the switched reluctance motor to respond faster in the near zero torque/current ranges as described further below. In accordance with aspects of the disclosed embodiment the dynamic response of the variable reluctance motor may be improved as indicated next. Given the following equations $$T_{VRM} \propto i^2 f(\theta) \quad [14]$$

$$\frac{d}{dt}T_{VRM} \propto 2f(\theta)i\frac{d}{dt}i + i^2\frac{d}{dt}f(\theta)\dot{\theta} \Rightarrow \frac{d}{dt}T_{VRM} \approx 0 \text{ at } i = 0 \quad [15]$$

where $T_{VRM}$ is the Variable (or Switched) Reluctance Motor Torque, "i" is the phase current, "θ" is the rotor position and "f(θ)" represents a dependency on rotor position; it follows from equation [15] that the dynamic response of a variable reluctance reluctance motor, such as motor 100, may be a function of phase current; the dynamic response of the variable reluctance motor ($dT_{VRM}/dt$) increases with an increase in the phase current; and the dynamic response is substantially zero when there is no current through the coils 104 (FIG. 1E and 1F).

In this aspect of the disclosed embodiment, referring again to FIGS. 1E and 1F, the commutation scheme is to have a non-zero phase current at zero torque. The non-zero phase current may create a "bias torque" in other phases of the motor so that the dynamic response time of the motor is increased (e.g. made faster) (e.g. the gradient between T=0 and the demanded torque $T_{demand}$ is changed). In a four phase motor, such as motor 100, energizing two phases (the phases being energized are determined by rotor position) results in a torque in one direction and energizing the remaining two phases results in a torque in the opposite direction. Nominally, only two phases are energized depending on the direction of torque. Here, the commutation scheme energizes all four phases such that when the torque demanded of the motor is substantially zero, the positive torque due to two phases A, B is balanced by the negative torque due to the remaining two phases C, D and the net torque is zero. Energizing all four phases A-D in a balanced manner (e.g. so the net torque is substantially zero or balanced) substantially provides a non-zero current even at a zero torque state of the motor 100 and improves the response time of the variable reluctance actuator (or the effective bandwidth) as expressed by equation [15].

Figure 16:
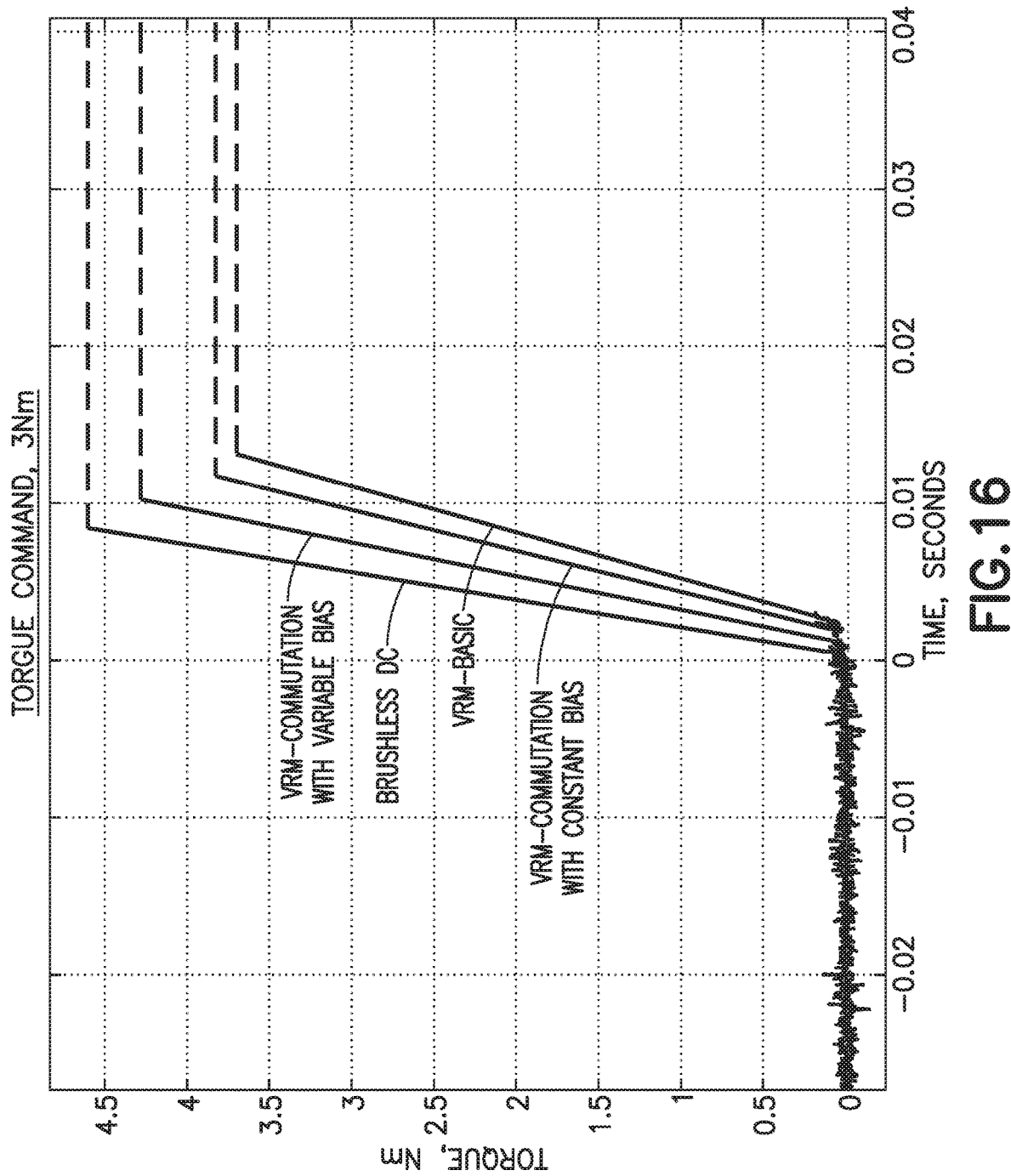
FIG. 16 illustrates an exemplary comparison table in accordance with aspects of the disclosed embodiment.
Figure 17:
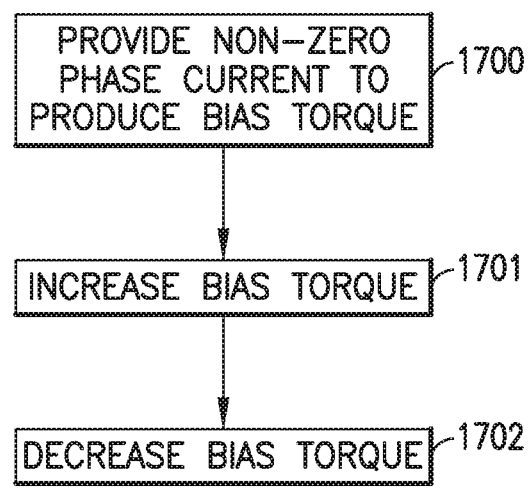
FIG. 17 illustrates a flow chart in accordance with aspects of the disclosed embodiment.

As an example, if at a given motor position, phases A and B contribute to a positive motor torque and phases C and D contribute to a negative motor torque, and the desired torque is T and ΔT is a chosen bias torque offset value, and function f represents the torque-current-position relationships, the phase currents can be defined as $$(i_A, i_B) = f(\theta, T+\Delta T) \quad [18]$$

and $$(i_C, i_D) = f(\theta, -\Delta T) \quad [19]$$

where $i_A$, $i_B$, $i_C$ and $i_D$ are the phase currents in phases A-D respectively. Here the net motor torque may be substantially equal to T and the bias torque offset value ΔT may be chosen in any suitable manner to be an arbitrarily small value. The bias torque offset value ΔT may result in an increase in phase currents that may be determined from commutation relationships, such as those described above. FIG. 16 illustrates the motor torque step response to a commanded torque of, for example, about 3 Nm for a brushless DC motor, a variable reluctance motor with no phase current bias (basic VRM), a variable reluctance motor with constant phase current bias (e.g. the bias substantially does not change with actuation of the motor when a non-balanced torque, i.e. $T_{demand}$, is produced) and a variable reluctance motor with variable phase current bias (e.g. the bias changes with actuation of the motor when a non-balanced torque, i.e. $T_{demand}$, is produced). FIG. 16 illustrates for comparative purposes, the response profiles to desired torque of the different motor configurations. The dashed portions of the plots represent approximate performance to the steady state operating conditions and are included for completeness, but otherwise are unrelated to the aspects of the features described herein. As can be seen in FIG. 16, the response (rise) time of the variable reluctance motor with a constant phase current bias decreases (i.e. faster response) over the basic VRM (no torque bias) and the response time of the variable reluctance motor with variable phase current bias decreases over the response time of the variable reluctance motor with constant phase current bias. In order to minimize a loss of motor power the offset torque may be set to a non-zero value as required and as determined by the application. In one aspect the non-zero phase current may be applied to produce the offset torque at any suitable time (FIG. 17, Block 1700) such as within a predetermined time period or at a predetermined time prior to an expected time the demanded $T_{demand}$ is needed (i.e. the offset torque may be considered a pre-torque that is applied just before the demanded torque is needed), rather than being applied coincidentally with the demanded torque. Also, as shown in FIG. 16, a time-varying torque offset profile may result in a faster dynamic response than a constant torque offset. In one aspect, to enable a faster dynamic response in, for example, robotic transport applications the controller, such as controller 400, may be configured to ramp up the bias torque (e.g. set to a predetermined start value) at the start of or just prior to (e.g. with pre-torque command to produce the pre-torque described above) the robotic manipulator (such as transport device 111 in FIG. 1E) movement (FIG. 17, Block 1701) and ramped down (e.g. decreased to a value lower than the predetermined start value) as the move begins and/or before the demanded or maximum torque and/or acceleration (e.g. the acceleration of a substrate carried by the transport device) is reached (FIG. 17, Block 1702). This ramping up and ramping down of the bias torque may substantially prevent or otherwise reduce any "overshoot" (e.g. moving past) of the robotic manipulator with respect to a desired pick or place target. In one aspect the ramp up and ramp down bias torque profiles can be chosen to be several orders of magnitude shorter in duration than the robotic manipulator move duration (e.g. the ramp up and ramp down durations are negligible compared to the duration of the robotic manipulator move). In other aspects the ramp up and ramp down profiles may have any suitable duration. In one aspect the ramp up and ramp down bias torque profiles may have substantially zero slopes at zero torque and the duration of the ramp up and ramp down may be determined by available bus voltage and/or motor coil inductance. As may be realized, the bias torque may be provided at more than one region of the robotic manipulator move (e.g. at the start of the move, at the end of the move and/or at one or more points in between start and end of the move). In one aspect the ramp up of the torque bias may be a gradual increase of the bias torque. In another aspect the ramp down of the bias torque may depend on a desired dynamic response time.

As described above, the controller 400 (FIG. 1E) may have a distributed architecture that includes high level controllers and lower level controllers similar to that described in U.S. Pat. No. 7,904,182 (previously incorporated herein by reference in its entirety). In one aspect the iso-torque tables may be resident in one or more high level controllers such that aspects of the commutation schemes, which may include any suitable calculations, comparisons, sending commands to the variable reluctance motors, monitoring operational characteristics of the variable reluctance motors, modifying the torque output of the motor, etc. may be performed by one or more lower level controllers.

As may be realized, the aspects of the disclosed embodiments may be employed individually or in any suitable combination.

In accordance with one or more aspects of the disclosed embodiment a variable reluctance motor load mapping apparatus is provided. The apparatus includes a frame, an interface disposed on the frame configured for mounting a variable reluctance motor, a static load cell mounted to the frame and coupled to the variable reluctance motor, and a controller communicably coupled to the static load cell and the variable reluctance motor. The controller being configured to select at least one motor phase of the variable reluctance motor, energize the at least one motor phase, and receive motor operational data from at least the static load cell for mapping and generating an array of motor operational data look up tables.

In accordance with one or more aspects of the disclosed embodiment, the controller is configured to receive motor operational data from the static load cell and the variable reluctance motor where the motor operational data includes at least one of a static motor torque, a respective phase current for each of the at least respective motor phase and a motor rotor position.

In accordance with one or more aspects of the disclosed embodiment, the controller is configured to generate from the motor operational data constant torque values as a function of rotor position and phase currents for adjacent motor phases.

In accordance with one or more aspects of the disclosed embodiment, the controller is configured to generate minimum power values associated with each constant torque value and provide the minimum power values in a look up table.

In accordance with one or more aspects of the disclosed embodiment, the controller is configured to generate motor operational data look up tables where each motor operational data look up table includes an array of constant torque values and corresponding phase currents for a given rotor position.

In accordance with one or more aspects of the disclosed embodiment, the controller is configured to, for an array of predetermined rotor positions corresponding to each predetermined rotor position, energize adjacent motor phases at an array of predetermined current combinations and receive, from the static load cell, a resultant static torque for each of the predetermined current combinations.

In accordance with one or more aspects of the disclosed embodiment, the controller is configured to, for each predetermined rotor position and a predetermined first motor phase current, vary an additional motor phase current or any suitable combinations of additional phase currents.

In accordance with one or more aspects of the disclosed embodiment, the controller is configured to generate torque values from the resultant static torque and map the torque values and associated phase current combinations for each predetermined rotor position to form the array of motor operational data look up tables.

In accordance with one or more aspects of the disclosed embodiment a method for characterizing the relationship between torque, current and position of determining motor load for a variable reluctance motor is provided. The method includes providing a static load cell, coupling the variable reluctance motor to the static load cell, selecting at least one motor phase of the variable reluctance motor, energizing the at least one motor phase, receiving with a controller motor operational data from at least the static load cell, and mapping and generating with the controller an array of motor operational data look up tables.

In accordance with one or more aspects of the disclosed embodiment, the method further includes receiving with the controller motor operational data from the static load cell and the variable reluctance motor where the motor operational data includes at least one of a static motor torque, a respective phase current for each of the at least respective motor phase and a motor rotor position.

In accordance with one or more aspects of the disclosed embodiment, the method includes generating, with the controller from the motor operational data, constant torque values as a function of phase currents and rotor position.

In accordance with one or more aspects of the disclosed embodiment, the controller is configured to generate minimum power values associated with each constant torque value and provide the minimum power values in a look up table.

In accordance with one or more aspects of the disclosed embodiment, each motor operational data look up table includes an array of constant torque values and corresponding phase currents for a given rotor position.

In accordance with one or more aspects of the disclosed embodiment, the method includes energizing, with the controller, motor phases at an array of predetermined current combinations for an array of predetermined rotor positions and receiving from the static load cell a resultant static torque for each of the predetermined current combinations and corresponding rotor positions.

In accordance with one or more aspects of the disclosed embodiment, the method includes varying an additional motor phase current with the controller for each predetermined rotor position and a predetermined first motor phase current.

In accordance with one or more aspects of the disclosed embodiment, the method includes generating, with the controller, torque values from the resultant static torque and mapping the torque values and associated phase current combinations for each predetermined rotor position to form the array of motor operational data look up tables.

In accordance with one or more aspects of the disclosed embodiment, a method includes coupling a load to an output shaft of a variable reluctance motor, generating an array of static torques on the output shaft with the variable reluctance motor, adjusting a rotor position of the variable reluctance motor and recording, with a controller, motor data that includes a static torque value, rotor position, and phase currents for adjacent phases of the variable reluctance motor.

In accordance with one or more aspects of the disclosed embodiment, an array of phase current combinations are recorded for adjacent phases for each static torque value in the array of static torques.

In accordance with one or more aspects of the disclosed embodiment, an array of static torques is generated for each rotor position in an array of rotor positions.

In accordance with one or more aspects of the disclosed embodiment, the method includes mapping, with the controller, the array of static torques and respective phase current combinations for each rotor position to form a data look up table.

In accordance with one or more aspects of the disclosed embodiment, the method includes energizing, with the controller, motor phases at an array of predetermined current combinations for an array of predetermined rotor positions and recording resultant static torque values for each of the predetermined current combinations and corresponding rotor positions.

In accordance with one or more aspects of the disclosed embodiment, the method includes varying additional motor phase(s) current with the controller for each predetermined rotor position and a predetermined first motor phase current.

In accordance with one or more aspects of the disclosed embodiment, an electric machine is provided. The brushless electric machine includes a passive rotor with at least one rotor pole, a stator with at least one stator pole and a phase coil associated with each of the at least one stator pole, the phase coil being configured to establish a flux in a magnetic circuit between the rotor and stator where the rotor and stator define a predetermined electric machine form factor, and a controller configured to control current to each phase coil to generate a predetermined rotor torque, the controller being programmed with at least predetermined constant torque values and related phase current values so that the controller determines the current for each phase coil for the generation of demanded rotor torque based on the predetermined constant torque values and related phase current values.

In accordance with one or more aspects of the disclosed embodiment the predetermined constant torque values and related phase current values are empirically generated values.

In accordance with one or more aspects of the disclosed embodiment the predetermined constant torque values and related phase current values of the brushless electric machine are generated from system modeling analysis including one of a numerical modeling analysis or finite element analysis.

In accordance with one or more aspects of the disclosed embodiment, the brushless electric machine comprises a variable reluctance motor that is either rotary or linear configuration.

In accordance with one or more aspects of the disclosed embodiment, the brushless electric machine comprises a variable reluctance motor configured for operation in a vacuum environment.

In accordance with one or more aspects of the disclosed embodiment, the passive rotor is a coil-less and magnet-less rotor.

In accordance with one or more aspects of the disclosed embodiment, the related phase current values are an array of phase current values so that each phase current vector produces the predetermined constant torque value common to the array of phase current values.

In accordance with one or more aspects of the disclosed embodiment, the controller is programmed with minimum power values associated with each of the predetermined constant torque values.

In accordance with one or more aspects of the disclosed embodiment, the predetermined constant torque values and related power values and phase current values are commutative to every electric machine having a similar form factor to the predetermined electric machine form factor.

In accordance with one or more aspects of the disclosed embodiment, the related phase current values are premeasured current values.

In accordance with one or more aspects of the disclosed embodiment, the constant torque values and related phase current values form one or more commutation tables relating torque, rotor position and phase current magnitudes of motor phases.

In accordance with one or more aspects of the disclosed embodiment, variable reluctance motor controller is provided. The controller includes one or more sensors configured to measure predetermined operating characteristics of a variable reluctance motor, a current loop module configured to provide a phase voltage to the variable reluctance motor, and a torque ripple estimator configured to generate, based on the predetermined operating characteristics, and apply a substantially real time phase voltage correction signal to the phase voltage to attenuate torque ripple effects of the variable reluctance motor.

In accordance with one or more aspects of the disclosed embodiment, the predetermined operating characteristics include one or more of motor rotor position, motor rotor angular velocity, phase current for each motor phase, flux linkage rate and inductance of each phase.

In accordance with one or more aspects of the disclosed embodiment, the flux linkage rate is determined from a measured value.

In accordance with one or more aspects of the disclosed embodiment, the one or more sensors includes a pick up coil disposed at or adjacent each motor phase coil, the pick up coil being configured to measure a flux linkage associated with a respective motor phase coil.

In accordance with one or more aspects of the disclosed embodiment, the inductance is an estimated inductance obtained by the controller from a lookup table or motor model.

In accordance with one or more aspects of the disclosed embodiment, the variable reluctance motor controller includes an inductance module configured to determine changes in the inductance of the motor with respect to motor rotor position and phase current.

In accordance with one or more aspects of the disclosed embodiment, the torque ripple estimator comprises a real time comparator between a desired motor torque and an actual motor torque such that the phase voltage correction signal causes the actual motor torque to approach the desired motor torque.

In accordance with one or more aspects of the disclosed embodiment, a brushless electric machine is provided. The brushless electric machine includes a passive rotor with at least one rotor pole, a stator with at least one stator pole and a phase coil associated with each of the at least one stator pole, the phase coil being configured to establish a flux in a magnetic circuit between the rotor and stator where the rotor and stator define a predetermined electric machine form factor, and a controller configured to control current to each phase coil to generate a predetermined rotor torque, the controller being programmed so that a non-zero phase current is provided to each phase coil at a motor output of zero torque.

In accordance with one or more aspects of the disclosed embodiment, the non-zero phase current provided to each phase coil effects a net torque substantially equal to zero.

In accordance with one or more aspects of the disclosed embodiment, the non-zero phase current effects a decrease in a dynamic response time (i.e. increased speed of response) of the brushless electric machine.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of the appended claims. Further, the mere fact that different features are recited in mutually different dependent or independent claims does not indicate that a combination of these features cannot be advantageously used, such a combination remaining within the scope of the aspects of the invention.

What is claimed is:

1. A variable reluctance motor load mapping apparatus comprising:
   a frame;
   an interface disposed on the frame configured for mounting a variable reluctance motor;
   a static load cell mounted to the frame separate and distinct from the variable reluctance motor and coupled to the variable reluctance motor so as to react motor torque of the variable reluctance motor; and
   a controller communicably coupled to the static load cell and the variable reluctance motor, the controller being configured to select at least one motor phase of the variable reluctance motor, energize the at least one motor phase, and receive, from the static load cell, motor operational data from at least a static load cell static reaction of the motor torque of the variable reluctance motor for mapping and generating an array of motor operational data look up tables.

2. The apparatus of claim 1, wherein the controller is configured to receive motor operational data from the static load cell and the variable reluctance motor where the motor operational data includes at least one of a static motor torque, a respective phase current for each of the at least one respective motor phase and a motor rotor position.

3. The apparatus of claim 1, wherein the controller is configured to generate from the motor operational data constant torque values as a function of rotor position and phase currents for adjacent motor phases.

4. The apparatus of claim 3, wherein the controller is configured to generate minimum power values associated with each constant torque value and provide the minimum power values in a look up table.

5. The apparatus of claim 1, wherein the controller is configured to generate motor operational data look up tables where each motor operational data look up table includes an array of constant torque values and corresponding phase currents for a given rotor position.

6. The apparatus of claim 1, wherein the controller is configured to, for an array of predetermined rotor positions corresponding to each predetermined rotor position, energize more than one motor phase at an array of predetermined current combinations and receive, from the static load cell, a resultant static torque for each of the predetermined current combinations.

7. The apparatus of claim 6, wherein the controller is configured to, for each predetermined rotor position and a predetermined first motor phase current, vary an additional motor phase current or any suitable combinations of additional phase currents.

8. The apparatus of claim 6, wherein the controller is configured to generate torque values from the resultant static torque and map the torque values and associated phase current combinations for each predetermined rotor position to form the array of motor operational data look up tables.

9. A method for characterizing the relationship between torque, current and position of a variable reluctance motor, the method comprising:
   coupling a static load cell to an output shaft of a variable reluctance motor;
   generating an array of static torques on the output shaft with the variable reluctance motor, the output shaft being held static by the static load cell;
   adjusting a rotor position of the variable reluctance motor;
   selecting, with a controller, adjacent phases of the variable reluctance motor from all respective motor phases of the variable reluctance motor and energizing the selected adjacent phases; and recording, with the controller, motor data that includes a static torque value, rotor position, and phase currents for the selected adjacent phases of the variable reluctance motor.

10. The method of claim 9, wherein an array of phase current combinations are recorded for more than one phase for each static torque value in the array of static torques.

11. The method of claim 9, wherein an array of static torques is generated for each rotor position in an array of rotor positions.

12. The method of claim 11, further comprising mapping, with the controller, the array of static torques and respective phase current combinations for each rotor position to form a data look up table.

13. The method of claim 9, further comprising energizing, with the controller, the selected motor phases at an array of predetermined current combinations for an array of predetermined rotor positions and recording resultant static torque values for each of the predetermined current combinations and corresponding rotor positions.

14. A brushless electric machine comprising:
    a passive rotor with at least one rotor pole;
    a stator with at least one stator pole and a phase coil associated with each of the at least one stator pole;
    wherein the phase coil is configured to establish a flux in a magnetic circuit between the rotor and stator where the rotor and stator define a predetermined electric machine form factor; and
    a controller configured to control current to each phase coil to generate a predetermined rotor torque, the controller being programmed with at least predetermined constant torque values and related phase current values so that the controller determines the current for each phase coil for the generation of demanded rotor torque based on the predetermined constant torque values and related phase current values.

15. The brushless electric machine of claim 14, wherein the predetermined constant torque values and related phase current values are empirically generated values.

16. The brushless electric machine of claim 14, wherein the predetermined constant torque values and related phase current values of the brushless electric machine are generated from system modeling analysis including one of a numerical modeling analysis or finite element analysis.

17. The brushless electric machine of claim 14, further comprising a variable reluctance motor that is either rotary or linear configuration.

18. The brushless electric machine of claim 14, further comprising a variable reluctance motor configured for operation in a vacuum environment.

19. The brushless electric machine of claim 14, wherein the passive rotor is a coil-less and magnet-less rotor.

20. The brushless electric machine of claim 14, wherein the related phase current values are an array of phase current values so that each phase current vector produces the predetermined constant torque value common to the array of phase current values.

21. The brushless electric machine of claim 14, wherein the controller is programmed with minimum power values associated with each of the predetermined constant torque values.

22. The brushless electric machine of claim 21, wherein the predetermined constant torque values and related power values and phase current values are commutative to every electric machine having a similar form factor to the predetermined electric machine form factor.

23. The brushless electric machine of claim 14, wherein the related phase current values are premeasured current values.

24. The brushless electric machine of claim 14, wherein the constant torque values and related phase current values form one or more commutation tables relating torque, rotor position and phase current magnitudes of motor phases.

25. A brushless electric machine comprising:
a passive rotor with at least one rotor pole;
a stator with at least one stator pole and a phase coil associated with each of the at least one stator pole;
wherein the phase coil is configured to establish a flux in a magnetic circuit between the rotor and stator where the rotor and stator define a predetermined electric machine form factor; and
a controller configured to control current to each phase coil to generate a predetermined rotor torque, the controller being programmed so that a non-zero phase current is provided to each phase coil at a motor output of zero torque.

26. The brushless electric machine of claim 25, wherein the non-zero phase current provided to each phase coil effects a net torque substantially equal to zero.

27. The brushless electric machine of claim 25, wherein the non-zero phase current effects a decrease in a dynamic response time of the brushless electric machine.

28. A variable reluctance motor load mapping apparatus comprising:
a frame;
an interface disposed on the frame configured for mounting a variable reluctance motor;
a static load cell mounted to the frame separate and distinct from the variable reluctance motor and coupled to the variable reluctance motor; and
a controller communicably coupled to the static load cell and the variable reluctance motor, the controller being configured to select at least one motor phase of the variable reluctance motor, energize the at least one motor phase, and register with the controller a static motor torque, generated by the energized at least one motor phase of the variable reluctance motor, statically reacted by and at the static load cell corresponding to a section of the at least one motor phase so as to describe a relation between values of the static motor torque, with respect to a motor rotor position and a respective phase current for each of the selected at least one motor phase of the variable reluctance motor in operation.

29. The apparatus of claim 28, wherein at least the static load cell generates motor operational data, including at least one of the static motor torque, the respective phase current for each of the at least one respective motor phase and the motor rotor position, for mapping and generating motor operational data look up tables.

30. The apparatus of claim 29, wherein the controller receives the motor operational data from at least the static load cell for mapping and generating the motor operational data look up tables.

31. The apparatus of claim 28, wherein the controller is configured to receive motor operational data from the static load cell and the variable reluctance motor where the motor operational data includes at least one of the static motor torque, the respective phase current for each of the at least one respective motor phase and the motor rotor position.

32. The apparatus of claim 28, wherein the controller is configured to generate from motor operational data constant torque values as a function of the motor rotor position and phase currents for adjacent motor phases.

33. The apparatus of claim 32, wherein the controller is configured to generate minimum power values associated with each constant torque value and provide the minimum power values in a look up table.

34. The apparatus of claim 28, wherein the controller is configured to generate motor operational data look up tables where each motor operational data look up table includes an array of constant torque values and corresponding phase currents for a given rotor position.

35. The apparatus of claim 28, wherein the controller is configured to, for an array of predetermined motor rotor positions corresponding to each predetermined motor rotor position, energize more than one motor phase at an array of predetermined current combinations and receive, from the static load cell, a resultant static torque for each of the predetermined current combinations.

36. The apparatus of claim 35, wherein the controller is configured to, for each predetermined motor rotor position and a predetermined first motor phase current, vary an additional motor phase current or any suitable combinations of additional phase currents.

37. The apparatus of claim 35, wherein the controller is configured to generate torque values from the resultant static torque and map the torque values and associated phase current combinations for each predetermined motor rotor position to form an array of motor operational data look up tables.

* * * * *